US012813270B2

(12) United States Patent
Haba et al.

(10) Patent No.: US 12,813,270 B2
(45) Date of Patent: Nov. 24, 2026

(54) INTEGRATED COOLING ASSEMBLIES INCLUDING SIGNAL REDISTRIBUTION AND METHODS OF MANUFACTURING THE SAME

(71) Applicant: Adeia Semiconductor Bonding Technologies Inc., San Jose, CA (US)

(72) Inventors: Belgacem Haba, Saratoga, CA (US); Rajesh Katkar, Milpitas, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 447 days.

(21) Appl. No.: 18/512,547

(22) Filed: Nov. 17, 2023

(65) Prior Publication Data

US 2024/0387323 A1 Nov. 21, 2024

Related U.S. Application Data

(60) Provisional application No. 63/467,307, filed on May 17, 2023.

(51) Int. Cl.
*H10W 40/47* (2026.01)
*H10B 80/00* (2026.01)
(Continued)

(52) U.S. Cl.
CPC ............ *H10W 40/47* (2026.01); *H10B 80/00* (2023.02); *H10W 40/73* (2026.01);
(Continued)

(58) Field of Classification Search
CPC ..... H10W 90/00; H10W 90/10; H10W 90/22; H10W 90/288; H10W 90/297;
(Continued)

(56) References Cited

U.S. PATENT DOCUMENTS 4,274,479 A 6/1981 Eastman
5,309,986 A 5/1994 Itoh
(Continued)

FOREIGN PATENT DOCUMENTS

CN 109524373 A 3/2019
CN 111128976 A 5/2020
(Continued)

OTHER PUBLICATIONS

"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.
(Continued)

*Primary Examiner* — Fazli Erdem
(74) *Attorney, Agent, or Firm* — HG LAW LLP

(57) ABSTRACT

The present disclosure provides for integrated cooling systems including an integrated cooling assembly. The integrated cooling assembly includes a semiconductor device having an active side and a backside opposite the active side. The integrated cooling assembly includes a plurality of stacked and bonded layers that collectively form a cold plate, the cold plate comprising (i) a first side and a second side opposite the first side, the first side having a base surface, a support feature that extends downwardly from the base surface, and sidewalls that extend downwardly from the base surface and surround base surface and the support feature, and (ii) a first interconnect vertically disposed through the support feature, where the first interconnect is electrically coupled to the semiconductor device through direct hybrid bonds formed between the cold plate and the semiconductor device.

18 Claims, 13 Drawing Sheets

(51) Int. Cl.

| | |
|---|---|
| ***H10W 40/73*** | (2026.01) |
| ***H10W 70/63*** | (2026.01) |
| ***H10W 70/685*** | (2026.01) |
| ***H10W 74/15*** | (2026.01) |
| ***H10W 90/00*** | (2026.01) |

(52) U.S. Cl.
CPC ....... *H10W 70/635* (2026.01); *H10W 70/685* (2026.01); *H10W 90/00* (2026.01); *H10W 74/15* (2026.01); *H10W 90/724* (2026.01); *H10W 90/734* (2026.01); *H10W 90/791* (2026.01); *H10W 90/794* (2026.01)

(58) Field of Classification Search
CPC . H10W 90/722; H10W 40/22; H10W 70/652; H10W 20/435
See application file for complete search history.

(56) References Cited

U.S. PATENT DOCUMENTS 5,522,452 A 6/1996 Mizuno et al.
5,769,154 A 6/1998 Adkins et al.
6,056,044 A 5/2000 Benson et al.
6,351,384 B1 2/2002 Daikoku et al.
6,686,532 B1 2/2004 Macris
6,822,326 B2 11/2004 Enquist et al.
7,289,326 B2 10/2007 Heydari et al.
7,485,957 B2 2/2009 Brandenburg et al.
7,511,372 B2 3/2009 Chiu
7,523,617 B2 4/2009 Venkatasubramanian et al.
7,622,324 B2 11/2009 Enquist et al.
7,692,926 B2 4/2010 Henderson et al.
7,957,137 B2 6/2011 Prasher
7,978,473 B2 7/2011 Campbell et al.
7,997,087 B2 8/2011 Venkatasubramanian et al.
8,164,169 B2 4/2012 Chrysler et al.
8,630,091 B2 1/2014 Ward et al.
9,224,673 B2 12/2015 Chen et al.
9,299,641 B2 3/2016 Sekar et al.
9,355,932 B2 5/2016 Ankireddi et al.
9,391,143 B2 7/2016 Tong et al.
9,553,071 B1 1/2017 Haba
9,741,638 B2 8/2017 Hsieh et al.
9,741,696 B2 8/2017 Katkar et al.
9,746,248 B2 8/2017 Semenov et al.
9,768,149 B2 9/2017 Vadhavkar et al.
9,818,723 B2 11/2017 Haba
10,032,695 B2 7/2018 Iyengar et al.
10,083,934 B2 9/2018 Haba
10,157,818 B2 12/2018 Chen et al.
10,170,392 B2 1/2019 Chainer et al.
10,199,356 B2 2/2019 Kinsley
10,312,221 B1 6/2019 Agarwal et al.
10,332,823 B2 6/2019 Chen et al.
10,461,059 B2 10/2019 Koopmans et al.
10,694,641 B2 6/2020 Basu et al.
10,978,427 B2 4/2021 Li et al.
11,187,469 B2 11/2021 Karesh
11,355,418 B2 6/2022 Yu et al.
11,387,164 B2 7/2022 Wu et al.
11,598,594 B2 3/2023 Lewis et al.
11,996,351 B2 5/2024 Hsiao et al.
12,191,235 B2 1/2025 Haba et al.
2003/0157782 A1 8/2003 Kellar et al.
2004/0184237 A1 9/2004 Chang
2004/0251530 A1 12/2004 Yamaji
2005/0126766 A1 6/2005 Lee et al.
2005/0213301 A1 9/2005 Prasher
2006/0042825 A1 3/2006 Lu et al.
2006/0103011 A1 5/2006 Andry et al.
2007/0025082 A1 2/2007 Lee et al.
2007/0107875 A1 5/2007 Lee et al.
2007/0231969 A1 10/2007 Chrysler et al.
2008/0096320 A1 4/2008 Farrar
2009/0122491 A1 5/2009 Martin et al.
2010/0116534 A1 5/2010 Choi et al.
2010/0230805 A1 9/2010 Refai-Ahmed
2010/0300202 A1 12/2010 Joyce
2011/0129986 A1 6/2011 Libralesso et al.
2011/0205708 A1* 8/2011 Andry .................. H10W 40/47
438/122
2013/0044431 A1 2/2013 Koeneman
2013/0050944 A1 2/2013 Shepard
2013/0087904 A1 4/2013 Clark et al.
2014/0126150 A1 5/2014 Song et al.
2015/0194363 A1 7/2015 Jun et al.
2016/0276314 A1 9/2016 Ching et al.
2017/0012016 A1 1/2017 Joshi et al.
2017/0092565 A1 3/2017 Chen et al.
2017/0103937 A1 4/2017 Hsieh et al.
2018/0053730 A1 2/2018 Shao et al.
2018/0087842 A1 3/2018 Chainer et al.
2018/0090427 A1 3/2018 Bernstein et al.
2018/0160565 A1 6/2018 Parida
2018/0211900 A1 7/2018 Gutala et al.
2018/0308783 A1 10/2018 Refai-Ahmed et al.
2019/0008071 A1 1/2019 Kim
2019/0355706 A1 11/2019 Enquist et al.
2019/0385928 A1 12/2019 Leobandung
2020/0035583 A1 1/2020 Beauchemin et al.
2020/0105639 A1 4/2020 Valavala et al.
2020/0312742 A1 10/2020 Lofgreen et al.
2020/0343160 A1 10/2020 Mizerak et al.
2020/0350233 A1 11/2020 Mizerak et al.
2020/0352053 A1 11/2020 Mizerak et al.
2020/0395313 A1 12/2020 Mallik et al.
2021/0066164 A1 3/2021 Wu et al.
2021/0175143 A1 6/2021 Yu et al.
2021/0183741 A1 6/2021 Jha et al.
2021/0193548 A1 6/2021 Wan et al.
2021/0193620 A1 6/2021 Refai-Ahmed et al.
2021/0280497 A1 9/2021 Brun et al.
2021/0288037 A1 9/2021 Tao et al.
2021/0343690 A1* 11/2021 Salmon .................. H05K 1/141
2021/0378106 A1 12/2021 Iyengar et al.
2021/0378139 A1 12/2021 Rice et al.
2021/0410329 A1 12/2021 Yang et al.
2022/0037231 A1 2/2022 Hsiao et al.
2022/0087059 A1 3/2022 Sathyamurthy et al.
2022/0117115 A1 4/2022 Malouin et al.
2022/0130734 A1 4/2022 Chiu et al.
2022/0189850 A1 6/2022 Liff et al.
2022/0210949 A1 6/2022 Edmunds et al.
2022/0230937 A1 7/2022 Malouin et al.
2022/0302058 A1* 9/2022 Gao ...................... H10W 20/20
2022/0408592 A1 12/2022 Malouin et al.
2023/0048500 A1 2/2023 Malouin et al.
2023/0154828 A1 5/2023 Haba et al.
2023/0156959 A1 5/2023 Malouin et al.
2023/0207474 A1 6/2023 Uzoh et al.
2023/0245950 A1 8/2023 Haba et al.
2023/0284421 A1 9/2023 Malouin et al.
2023/0298969 A1 9/2023 Park et al.
2024/0038633 A1 2/2024 Haba et al.
2024/0203823 A1 6/2024 Uzoh et al.
2024/0222222 A1 7/2024 Haba et al.
2024/0222226 A1 7/2024 Haba
2024/0249995 A1 7/2024 Haba
2024/0249998 A1 7/2024 Gao et al.
2024/0266255 A1 8/2024 Haba et al.
2024/0387324 A1 11/2024 Haba et al.
2025/0087560 A1* 3/2025 Theil ..................... H10W 20/20
2025/0253209 A1 8/2025 Haba et al.

FOREIGN PATENT DOCUMENTS

CN 115719735 A 2/2023
JP 2000-340727 A 12/2000
KR 10-1049508 B1 7/2011
KR 10-2023-0136509 A 9/2023

(56) References Cited

FOREIGN PATENT DOCUMENTS

| | | | |
|---|---|---|---|
| TW | 200834871 | A | 8/2008 |
| WO | 2013/097146 | A1 | 7/2013 |

OTHER PUBLICATIONS

"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.
"Microconvective Liquid Cooling for high power electronics," https://jetcool.com/technology/, downloaded Mar. 7, 2024, 6 pages.
Benson D.A et al., "Micro-Machined Heat Pipes in Silicon MCM Substrates", Sandia National Laboratories, Sandia Report: SAND97-0100-UC-704, printed Jan. 1997, 17 pages.
International Search Report and Written Opinion mailed Jun. 5, 2024, in International Application No. PCT/US2024/013758, 9 pages.
International Search Report and Written Opinion mailed Mar. 16, 2023, in International Application No. PCT/US2022/050105, 9 pages.
International Search Report and Written Opinion mailed May 30, 2023, in International Application No. PCT/US2023/061494, 9 pages.
Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.
Walsh, Stephen Michael, "Microjet Impingement Cooling of High Power-Density Electronics," Thesis, submitted May 11, 2018, 93 pages.
Evan G. Colgan, "A Practical Implementation Of Silicon Microchannel Coolers", available online at <https://www.electronics-cooling.com/2007/11/a-practical-implementation-of-silicon-microchannel-coolers/>, Nov. 1, 2007, 10 pages.
Francisco Pires, "Tsmc Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.
IBM, "Functional electronic packaging-Thermal management roadmap", available online at <https://web.archive.org/web/20170220095511/https://www.zurich.IBM.com/st/electronicpackaging/cooling.html>, Feb. 20, 2017, 7 pages.
International Search Report and Written Opinion received for PCT Patent Application No. PCT/US23/28942, mailed on Nov. 16, 2023, 12 pages.
International Search Report and Written Opinion received for PCT Patent Application No. PCT/US23/84874, mailed on Apr. 22, 2024, 7 pages.
International Search Report and Written Opinion received for PCT Patent Application No. PCT/US23/85801, mailed on Apr. 26, 2024, 8 pages.
International Search Report and Written Opinion received for PCT Patent Application No. PCT/US23/85816, mailed on Apr. 23, 2024, 11 pages.
International Search Report and Written Opinion received for PCT Patent Application No. PCT/US23/86233, mailed on Apr. 26, 2024, 7 pages.
John H, "Recent Advances and Trends in Advanced Packaging", IEEE Transactions On Components, Packaging and Manufacturing Technology, IEEE, USA, vol. 12, No. 2, Jan. 20, 2022, pp. 228-252.
John H., "Chapter 3: Multiple System and Heterogeneous Integration with TSV-Interposers" In: "Chiplet Design and Heterogeneous Integration Packaging", Mar. 28, 2023, Springer Nature Singapore, Singapore, pp. 137-269.
Kaplan, F et al., "LoCool: Fighting Hot Spots Locally for System Energy Efficiency" IEEE Transactions on Computer-Aided Design of Intergrated Circuits and Systems, 39(4): 895-908 (2020).
U.S. Appl. No. 18/129,567, filed Mar. 31, 2023, First Name Inventor: Cyprian Emeka Uzoh, "Embedded Cooling Systems for Device Packages and Methods of Cooling Packaged Devices".
PCT Application No. PCT/US2024/022253, International Search Report and Written Opinion dated Jul. 17, 2024, 14 pages.
Shamsa, M., et al., "Thermal conductivity of diamond-like carbon films", Applied Physics Letters, vol. 89, No. 16, Oct. 20, 2006, p. 161921-161921-3.
Wu, C. J., et al., "Ultra High Power Cooling Solution for 3D-Ics", 2021 Symposium on VLSI Technology, Jun. 2021, 2 pages.
U.S. Appl. No. 18/953,868, filed Nov. 20, 2024, Belgacem Haba.

* cited by examiner

INTEGRATED COOLING ASSEMBLIES INCLUDING SIGNAL REDISTRIBUTION AND METHODS OF MANUFACTURING THE SAME

CROSS-REFERENCE TO RELATED APPLICATION

This application claims the benefit of U.S. Provisional Patent Application No. 63/467,307, filed May 17, 2023, which is hereby incorporated by reference in its entirety.

FIELD

The present disclosure relates to advanced packaging for microelectronic devices, and in particular, integrated cooling assemblies including backside signal redistribution and methods of manufacturing the same.

BACKGROUND

As the demands in large-scale computing and other such fields rise, energy consumption in conjunction with chip layout management poses a critical challenge. In particular, area on a semiconductor chip's active side, or frontside, will be reserved for increasingly compact integrated circuitries (e.g., active components, passive components, processing, memory, etc.). Signal routing through fine pitch interconnects may be required to support the data traffic demand in, for example, large-scale computing systems. In some approaches, a device includes a redistribution layer (RDL) on a side of the chip, which may occupy valuable space that could be reserved to help address the large-scale computing demands and/or disadvantageously increase the form factor by adding an extra layer. Moreover, an RDL would not have a sufficiently flexible layout, for example, to couple two active circuitries at different pitches on the same side or opposite sides of an RDL in some approaches.

The increasingly compact active circuitries further increase power density and higher heat generation. Thermal dissipation in high-power density chips is continuing to be a critical challenge as improvements in chip performance, e.g., through increased gate density and multi-core microprocessors, have resulted in increased power density and a corresponding increase in thermal flux that contributes to elevated chip temperatures. In some approaches, backside wiring may interfere with a backside thermal dissipative system, for example, due to the thickness of a fluid housing. In such approaches, the interconnect pitch may become too large for the integrated circuitries. Thus, such systems would not meet the thermal budgets in large-scale computing systems and/or other computing systems.

Accordingly, there exists a need in the art for integrated cooling systems having backside signal redistribution (e.g., crossing a cold plate) and methods of manufacturing the same.

SUMMARY

The present disclosure is directed to integrated cooling systems providing signal redistribution and fluid cooling. In particular, embodiments described herein provide integrated device cooling assemblies having a signal redistribution network signal redistribution network on a different side than the active part of the device. Advantageously, the integrated device cooling assemblies reduce resistance in the thermal path and distribute signals between one or more devices through the thermal dissipative system in a manner that does not interfere with the thermal pathway. In one or more embodiments of the present disclosure, an integrated cooling assembly comprises an signal redistribution network that communicatively couples a plurality of devices. In one or more embodiments, an integrated cooling assembly may comprise a power and/or ground delivery network (PDN) for providing power/ground lines and a signal redistribution network for providing signal lines.

In one embodiment, a device package comprises a semiconductor device having an active side and a backside opposite the active side. The device package comprises a plurality of stacked and bonded layers. For example, the semiconductor device and the plurality of stacked and bonded layers may be part of an integrated cooling assembly. For example, the plurality of stacked and bonded layers may form a cold plate. The plurality of stacked and bonded layers may comprise a first side and a second side opposite the first side, the first side having a base surface, a support feature that extends downwardly from the base surface, and sidewalls that extend downwardly from the base surface and surround the base surface and the support feature. The plurality of stacked and bonded layers comprise a first interconnect vertically disposed through the support feature, wherein the first interconnect is electrically coupled to the semiconductor device through direct hybrid bonds formed between the first side of the plurality of stacked and bonded layers and the semiconductor device.

In one embodiment, a microelectronic package comprises a plurality of stacked and bonded layers. For example, the plurality of stacked and bonded layers may form a cold plate. The plurality of stacked and bonded layers may comprise a first side and a second side opposite the first side, the first side having a base surface, sidewalls that surround the base surface and extend downwardly therefrom to define a cavity, and a support feature disposed in the cavity. The plurality of stacked and bonded layers comprise a first interconnect vertically disposed through the support feature. The first interconnect is electrically coupled to a device through direct hybrid bonds formed between the first side and a backside of the device. The first side of the plurality of stacked and bonded layers and the backside of the device define a coolant channel therebetween.

In one embodiment, a device package comprises a semiconductor device having an active side and a backside opposite the active side. The device package comprises a plurality of stacked and bonded layers. For example, the semiconductor device and the plurality of stacked and bonded layers may be part of an integrated cooling assembly. For example, the plurality of stacked and bonded layers may form a cold plate. The plurality of stacked and bonded layers comprises a first layer and a second layer, the first layer having a base surface, a support feature that extends downwardly from the base surface to the second layer, and sidewalls that extend downwardly from the base surface to the second layer and surround the base surface and the support feature. The plurality of stacked and bonded layers comprises a first interconnect vertically disposed through the support feature. The first interconnect is electrically coupled to the semiconductor device through direct hybrid bonds formed between the second layer and the semiconductor device.

In one embodiment, a microelectronic package comprises a plurality of stacked and bonded layers. For example, the plurality of stacked and bonded layers may be part of an integrated cooling assembly. For example, the plurality of stacked and bonded layers may form a cold plate. The plurality of stacked and bonded layers comprises a first layer and a second layer, the first layer having a base surface, sidewalls that surround the base surface and extend downwardly therefrom to define a cavity between the first layer and the second layer, and a support feature disposed in the cavity. The plurality of stacked and bonded layers comprises a first interconnect vertically disposed through the support feature. the first interconnect is electrically coupled to a device through direct hybrid bonds formed between the second layer and a backside of the device. The first layer and the second layer of the plurality of stacked and bonded layers define a coolant channel therebetween.

In one embodiment, an integrated cooling assembly comprises a device and a cold plate. The device has an active side and a backside disposed opposite of the active side. The cold plate may have a first side and a second side opposite the first side. The first side of the cold plate may comprise a recessed side, sidewalls that surround the recessed side and extend downwardly therefrom to define a cavity, and a plurality of support features disposed in the cavity. The first side of the cold plate may be attached to the device backside to define a coolant channel therebetween. As described herein, having a cavity between the base surface and the device may be referred to as an open cavity configuration.

In one embodiment, an integrated cooling assembly comprises a semiconductor device and a cold plate. The cold plate may be disposed above the device (e.g., above a backside of the device). The integrated cooling assembly comprises a plurality of stacked and bonded layers that collectively forms the cold plate, wherein a first side of the cold plate has a base surface. The cold plate may comprise sidewalls that surround the base surface and extend downwardly to define a cavity. The cold plate may comprise a support feature disposed in the cavity and a first interconnect vertically disposed through the support feature. As described herein, an interconnect disposed through a support feature may be referred to as a thru interconnect. A thru interconnect may comprise a conductive line or a plurality of adjacent conductive segments that collectively form a conductive line. The support feature may be attached to the cold plate using one or more techniques (e.g., dielectric bonding, hybrid bonding, adhesive, solder, etc.). The cold plate may be attached to a side of the device (e.g., via direct bonding, hybrid bonding, etc.). For example, sidewalls and/or a support feature of the cold plate may be attached to the device to define a coolant channel between the base surface and the backside of the device. For example, the sidewalls and the support feature may be attached to the device through direct dielectric bonds. For example, the sidewalls and the support feature may be attached to the device using an adhesive. The first interconnect through the support feature may be connected to the device via direct bonding. For example, the first interconnect may be connected to a signal via of the device through direct hybrid bonds.

In some embodiments, the plurality of stacked and bonded layers comprises a stack of first layers. Each first layer may comprise an interconnect segment bonded to an interconnect segment of a vertically adjacent first layer to form the first interconnect. The plurality of stacked and bonded layers may comprise a second layer comprising a second interconnect disposed through the second layer (e.g., a substrate). As described herein, an interconnect disposed through a substrate may also be referred to as a thru-substrate interconnect. In some embodiments, the second interconnect is electrically coupled to the first interconnect of the first layers. For example, the second interconnect may be electrically coupled to the first interconnect through direct hybrid bonds formed between the stack of first layers and the second layer.

In one embodiment, the cold plate comprises a substrate, one or more sides including a first side and a second side, and one or more communicatively coupled conductive layers at the one or more sides. The first side of the cold plate may comprise a plurality of support features, each support feature comprising interconnects disposed through the support feature (e.g., vertically disposed vias or via segments). The thru interconnects may couple the cold plate to one or more devices attached to the cold plate at the support features. For example, the thru interconnects may be bonded to signal interconnects of a device. The device may be bonded at a surface of the support features. In some embodiments, the communicatively coupled conductive layers and the thru interconnects of the support features are part of a signal redistribution network. In some advantageous aspects, a signal redistribution network may enable signals to cross an integrated cooling assembly (e.g., through the cold plate) between devices coupled to the signal redistribution network (e.g., through the thru interconnects of the support features) and/or cooled by the integrated cooling assembly (e.g., via fluid coolant using the cold plate).

In some embodiments, the one or more conductive layers are coupled using one or more thru-substrate interconnects (e.g., conductive vias). For example, a first side of the cold plate may comprise a first conductive layer. A second side of the cold plate may comprise a second conductive layer. The thru-substrate interconnects may connect the first conductive layer and the second conductive layer through the substrate of the cold plate. For example, the thru-substrate interconnects may electrically connect the first conductive layer of the first side and the second conductive layer of the second side. In some embodiments, the first and/or second conductive layers may comprise a metallized component and/or at least partially formed using a metallization process. In some embodiments, a thru-substrate interconnect may have a greater lateral size (e.g., width, area, etc.) than an interconnect disposed through a support feature. For example, a thru-substrate interconnect may have a cross sectional area of 0.1 $mm^2$, and a thru interconnect at a support feature may have a cross sectional area of 0.0064 $mm^2$.

One or more sides of a cold plate may comprise a dielectric layer. For example, a dielectric layer may be disposed on a backside conductive layer of the cold plate. A second dielectric layer may be disposed on a frontside conductive layer. In a second non-limiting example, a dielectric layer may be disposed between the backside conductive layer and a substrate of the cold plate.

In some embodiments, sides of a support feature may comprise a conductive layer. For example, the sidewalls of a support feature may be metallized to form conductive layers. The metallized sides may provide locations at a base surface for additional connections with one or more device components.

One or more support features may be part of the cold plate (e.g., a support post extending outward from a recessed side of the cold plate). An interconnect of such a support feature may be a thru via that extends from a first surface of the support feature (e.g., the top surface) to a second surface of the support feature (e.g., the base). For example, the interconnect may vertically extend through a support pillar. In some embodiments, one or more support features may comprise a bonded layer stack. For example, a support feature may be formed by stacking and bonding a plurality of substrates. Each substrate may have one or more thru interconnect segments. One or more of the segments may be horizontally offset from other segments. In some embodiments, each substrate may have openings that are at least partially filled to form the interconnect segments after forming the bonded layer stack. For example, a conductive material (e.g., Cu) may be deposited in the openings to form the thru interconnect segments. One or more coatings (e.g., diffusion barrier layer, etc.) may be deposited in the openings prior to deposing the conductive material. A first layer of the bonded layer stack may be direct bonded to the next layer of the stack. In one embodiment, one or more layers of the bonded layer stack are direct dielectric bonded. Additionally, or alternatively, the one or more layers may be hybrid bonded. The bonding may connect a first interconnect segment to a second vertically adjacent interconnect segment.

One or more layers of the bonded layer stack may have different dimensions than another layer of the bonded layer stack (e.g., widths, heights, lengths, etc.). In some embodiments, respective interconnect segments of the one or more layers of the bonded layer stack may have different dimensions, spacing, etc. than an interconnect segment of another layer. As an illustrative, non-limiting example, a first layer of the stack has a width of 0.6 mm and a thickness of 0.2 mm. A pitch of the first layer's interconnects may be 0.1 mm. The second layer in the stack (e.g., the succeeding layer) may have a width of 0.5 mm and a thickness of 0.3 mm. A pitch of the second layer's interconnects may be 0.009 mm.

In some embodiments, the bonded layer stack may change in one or more dimensions starting at a first value at a first end of the stack and stopping at a second value at a second, opposing end of the stack. For example, a first layer may be disposed at a top of a support feature (e.g., at a first side of a cold plate). In this illustrative, non-limiting example, the width of the first layer may be 1.4 mm, and/or the thickness of the first layer may be 0.7 mm. A pitch of the first layer's interconnects may be 0.8 mm. The next layer in the stack may be 1.3 mm wide and/or 0.75 mm thick. A pitch of the next layer's interconnects may be 0.7 mm. A second layer may be disposed at a base of the support feature (e.g., at a device surface). The width and/or thickness trend may continue until the second layer at the base. In this example, the second layer at the base may be 0.8 mm wide and/or 1 mm thick. A pitch of the second layer's interconnects may be 0.2 mm. In some advantageous aspects, a support feature comprising a layer stack may provide interconnects at varying pitch (e.g., progressively reducing from large pitch interconnects at a backside of the cold plate to fine pitch interconnects at the interface with a device).

In some embodiments, a cold plate may comprise one or more electrically coupled conductive layers. For example, a first side of the cold plate may comprise a first conductive layer, and a second side of the cold plate may comprise a second conductive layer. The first conductive layer may be coupled to the second conductive layer using a plurality of thru interconnects (e.g., TSVs, wirebonds, etc.). The cold plate may be attached to a device through direct bonding (e.g., direct hybrid bonds) between sidewalls and/or one or more support features of the cold plate and the first conductive layer. In some embodiments, one or more sides of the cold plate may comprise a dielectric layer (e.g., disposed on the first conductive layer).

In some embodiments, an integrated cooling assembly comprises a cold plate having a first substrate and a second substrate, wherein the sidewalls and/or support features of the cold plate are disposed between the first and second substrates, defining a cavity therebetween. The cavity may be a coolant channel. As described herein, having a cavity between the cavity between the first substrate and the second substrate may be referred to as a closed cavity configuration. Each substrate may comprise one or more coupled conductive layers (e.g., connected using one or more thru substrate interconnects). In some embodiments, a device is attached the cold plate through bonding a backside of the device to a conductive layer of the second substrate. A conductive layer of the first substrate may be connected to a conductive layer of the second substrate through respective interconnects vertically disposed through one or more support features. For example, a first end of an interconnect may be directly bonded to a first conductive layer of the first substrate that is disposed facing inside the cavity. A second, opposing end of the interconnect may be directly bonded to a second conductive layer of the second substrate that is disposed facing inside the cavity. In some embodiments, the first and second substrates comprise a rigid material for providing structural support. For example, the first substrate may comprise structural Si. Additionally, or alternatively, one or more substrates of the cold plate may comprise device components, integrated circuitry, etc.

An integrated cooling assembly comprising a signal redistribution network may be implemented as an interposer (e.g., a 2.5D interposer). The integrated cooling assembly may have an open cavity configuration (e.g., a coolant channel between a base surface of a cold plate and a device) or a closed cavity configuration (e.g., a coolant channel between two substrates of a cold plate). In some embodiments, the integrated cooling assembly may be connected to a device, for example, at a conductive pad. For example, the device may include a passive component or another circuit component. For example, the device may be a chiplet. The device may be attached to a base surface of a cold plate and disposed in the cavity of the cold plate (e.g., in an open cavity configuration). In such embodiments, the device may be connected to a part of a PDN. For example, a first part of a PDN may provide power to the device, and a second part of the PDN may provide ground to the device. The device may provide various functions for one or more devices coupled to the signal redistribution network at other locations of the cold plate. The device may include a dielectric coating comprising a material that would protect against damage from coolant in a coolant channel.

In some embodiments, the integrated cooling assembly may comprise a plurality of devices attached to a first side of a cold plate. For example, first and second integrated circuit (IC) devices may be attached to a conductive layer at a backside of the cold plate. For example, a stacked memory device may be attached to the conductive layer. The first IC device may be communicatively coupled to the second IC device through the conductive layer. In this manner, a plurality of devices may be communicatively coupled through a signal redistribution network and cooled without interfering with the inter-device communication (e.g., by running a coolant fluid through the coolant channel).

In some embodiments, the integrated cooling assembly may comprise a plurality of devices attached to different sides of a cold plate. For example, a first IC device may be attached to a backside of a cold plate. A second IC device may be attached to a frontside of a cold plate. Each device may have respective connections to the signal redistribution network. For example, the first IC device may have a plurality of conductive pads directly bonded to opposing pads on the backside conductive layer of the cold plate. For example, the second IC device may comprise a plurality of conductive vias that are connected to the frontside conductive layer through hybrid bonding. For example, the second IC device may be attached to sidewalls and/or support features of the cold plate in an open cavity configuration. In this configuration, signal vias of the second IC device may be bonded to interconnects disposed through the support features. The IC devices, via their respective connections to a part of the signal redistribution network, may communicate signals therebetween.

In some embodiments, the IC devices are attached to one or more sides of a cold plate using different bonding techniques. For example, the first IC device may be attached to a backside conductive layer using direct hybrid bonds. For example, a second IC device may be attached to a front side conductive layer using an adhesive material (e.g., solder, a polymer layer, etc.) Each IC device has respective connections to the signal redistribution network (e.g., formed through direct bonding, wires, solder, etc.).

In some embodiments, the integrated cooling assembly comprises a logic device (e.g., a programmable logic chip, complex programmable logic devices, field-programmable gate array, image sensors, processing units, etc.) attached to a first side of a cold plate (e.g., in an open or closed cavity configuration). A second device (e.g., logic devices, memory devices, processors, etc.) may be attached a second side of the cold plate. In some embodiments, the second device is communicatively coupled to the logic device through the signal redistribution network. Additionally, or alternatively, one or more interconnects may be disposed through one or more support features of the cold plate, for example, by increasing a number and/or density of interconnects at the one or more support features. These interconnects may provide a plurality of communication channels between a first component of the second device and a second component of the logic device through the signal redistribution network. As described herein, interconnects of a support feature configured to provide high speed communication between device components may be referred to as high-speed interconnects. In some embodiments, a high-speed interconnect is disposed through a peripheral support feature located at a periphery of the cold plate. As an illustrative example, a memory stack may be attached to a backside of the cold plate and communicatively coupled to the logic device through the signal redistribution network. A non-peripheral support feature may have three interconnects. A peripheral support feature may have a higher density of interconnects that a non-peripheral support feature (e.g., four or more interconnects in the same lateral area as the three interconnects of the non-peripheral support feature). The peripheral support feature may be adjacent to a coolant line attachment of the integrated cooling assembly (e.g., next to an inlet). In this example, the interconnects of the peripheral support feature provide a higher number of communication channels between the memory stack and the logic device. In some embodiments, a logic device is attached to a first side of a cold plate, and a plurality of devices are attached to a second side of a cold plate. Each device of the plurality of devices may be communicatively coupled to the logic device through a signal redistribution network of the cold plate. The signal redistribution network may comprise a respective plurality of high-speed interconnects between each device of the plurality of devices and the logic device.

In some embodiments, a semiconductor device may comprise a redistribution layer. The redistribution layer may comprise interconnections between a first interconnect of a cold plate and circuitry at a side of the device (e.g., the active side). In some embodiments, a side of the semiconductor device may comprise one or more conductive elements disposed therein, thereon, and/or therethrough. For example, a plurality of blind vias may be disposed through the backside of the device. For example, a plurality of conductive pads may be disposed at the backside of the device.

In some embodiments, a first interconnect disposed through a support feature has a height of about 10 um or more, such as about 50 um or more, about 100 um or more, about 150 um or more, about 200 um or more, about 250 um or more, about 300 um or more, about 400 um or more, about 500 um or more, about 600 um or more, about 700 um or more, about 800 um or more, about 900 um or more, or about 1000 um or more.

In some embodiments, one or more segments of a first interconnect disposed through a support feature has an aspect ratio of about 50 or less, such as about 45 or less, about 40 or less, about 35 or less, about 30 or less, about 25 or less, about 20 or less, about 15 or less, about 10 or less, about 9 or less, about 8 or less, about 7 or less, about 6 or less, or about 5 or less.

The present disclosure provides for processes of manufacturing the integrated cooling systems providing signal redistribution and fluid cooling. In an example process, a substrate may be prepared having a first side. The substrate may comprise sidewalls extending downwardly from the first side to define a cavity. One or more support features may be disposed in the cavity. A base surface may be formed at the substrate by stacking and bonding a plurality of layers having respective interconnect segments, wherein the sidewalls surround the base surface. The stacking and bonding may comprise connecting the respective interconnect segments, for example, to form a first interconnect vertically disposed through a support feature. A cold plate may be formed from the substrate and the stacked and bonded layers. The sidewalls and/or one or more support features of the cold plate may be attached to a device. For example, the device may have an active side and a backside opposite to the active side. The sidewalls and a support feature may be attached to the backside of the device, defining a coolant channel between the base surface and the backside of the device. Attaching the support feature may comprise connecting a first interconnect of the support feature to the device through bonding (e.g., direct hybrid bonding).

BRIEF DESCRIPTION OF THE DRAWINGS

The above and other objects and advantages of the disclosure will be apparent upon consideration of the following detailed description, taken in conjunction with the accompanying drawings, in which.

Figure 1A:
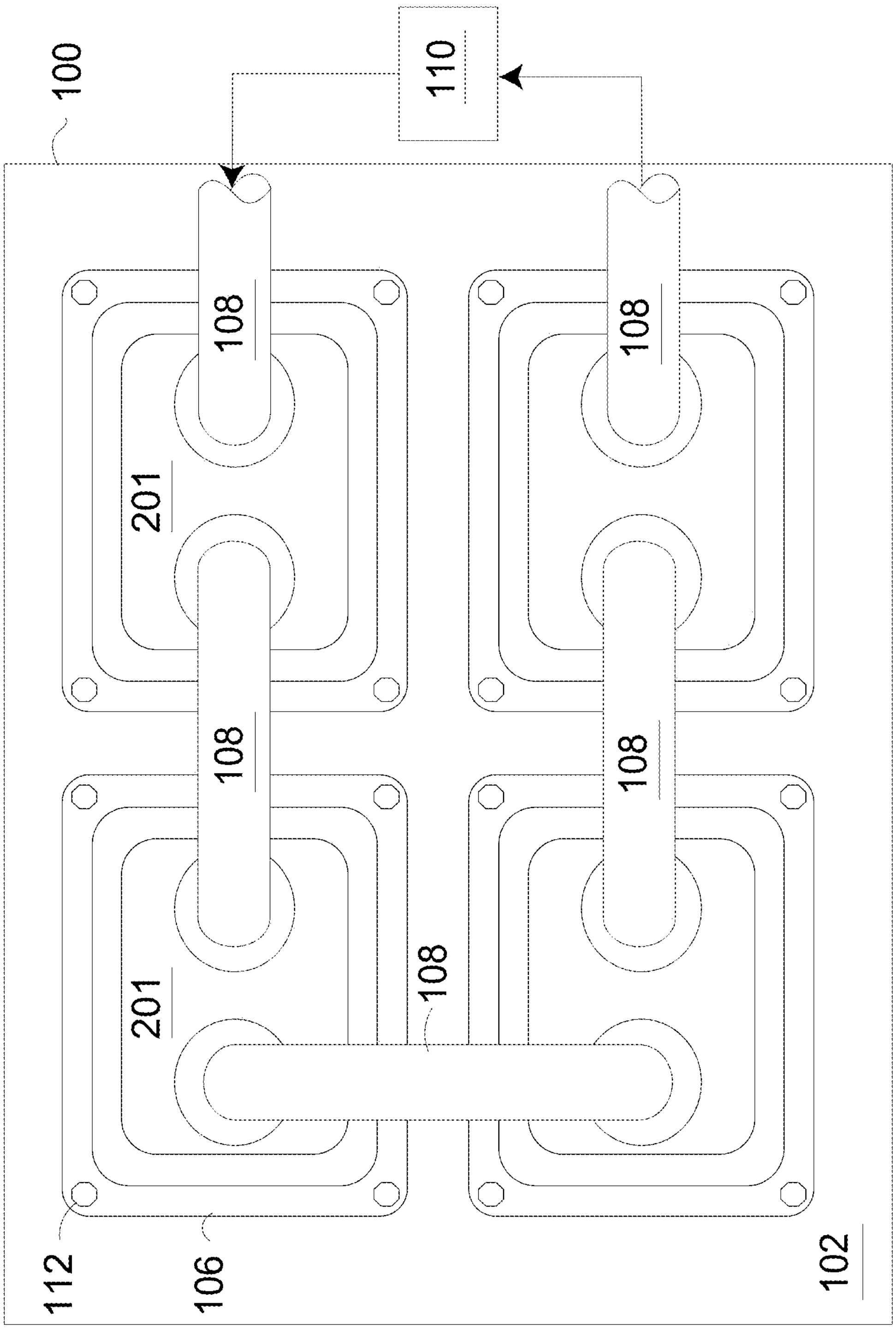
FIG. 1A is a schematic plan view of an example of a system panel, in accordance with embodiments of the present disclosure.

The figures herein depict various embodiments of the present disclosure for purposes of illustration only. It will be appreciated that additional or alternative structures, assemblies, systems, and methods may be implemented within the principles set out by the present disclosure.

DETAILED DESCRIPTION

As used herein, the term “substrate” means and includes any workpiece, wafer, or article that provides a base material or supporting surface from which or upon which components, elements, devices, assemblies, modules, systems, or features of the heat-generating devices, packaging components, and cooling assembly components described herein may be formed. The term substrate also includes “semiconductor substrates” that provide a supporting material upon which elements of a semiconductor device are fabricated or attached, and any material layers, features, and/or electronic devices formed thereon, therein, or therethrough. For example, a substrate may comprise a rigid material such as crystalline or polycrystalline silicon.

As described below, the semiconductor substrates herein generally have a “device side,” e.g., the side on which semiconductor device elements are fabricated, such as transistors, resistors, and capacitors, and a “backside” that is opposite the device side. The term “active side” should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term “non-active side” (opposite the active side) includes the non-active side of the substrate at any stage of device fabrication, including the surfaces of any material layer, any feature formed thereon, or extending outwardly therefrom, and/or any openings formed therein. Thus, the terms “active side” or “non-active side” may include the respective surfaces of the semiconductor substrate at the beginning of device fabrication and any surfaces formed during material removal, e.g., after substrate thinning operations. Depending on the stage of device fabrication or assembly, the terms “active” and “non-active sides” are also used to describe surfaces of material layers or features formed on, in, or through the semiconductor substrate, whether or not the material layers or features are ultimately present in the fabricated or assembled device.

Spatially relative terms are used herein to describe the relationships between elements, such as the relationships between substrates, heat-generating devices, cooling assembly components, device packaging components, and other features described below. Unless the relationship is otherwise defined, terms such as “above,” “over,” “upper,” “upwardly,” “outwardly,” “on,” “below,” “under,” “beneath,” “lower,” and the like are generally made with reference to the X, Y, and Z directions set forth in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as “disposed on,” “embedded in,” “coupled to,” “connected by,” “attached to,” “bonded to,” “proximate to,” either alone or in combination with a spatially relevant term include both relationships with intervening elements and direct relationships where there are no intervening elements. The term “at the” generally denotes an element that is disposed on, embedded in, coupled to, connected by, attached to, bonded to, or proximate to another element.

Unless otherwise noted, the term “cold plate” generally refers to a base plate, or a stack of base plates directly bonded to one another, which may be bonded to the semiconductor device. The cold plate may include material layers and/or metal features formed on or in a surface of the base plate or stack of base plates that facilitate direct dielectric or hybrid bonding with a semiconductor device. For example, the cold plate may comprise Si, glass, Cu, Al, etc. The term “integrated cooling assembly” generally refers to a cold plate attached to a semiconductor device so as to form a single piece, such as by use of the direct bonding methods described below. The direct bonding methods enable heat from the semiconductor device to be directly transferred to a coolant fluid flowed between the cold plate and the semiconductor device. Unless otherwise noted, the device packages and cold plates described herein may be used with any selected fluid coolant, e.g., liquid, gas, and/or vapor-phase coolants. Thus, the terms should not be construed as limiting the coolant to any one fluid phase.

FIG. 1A is a schematic plan view of an example of a system panel 100, in accordance with embodiments of the present disclosure. Generally, the system panel 100 includes a printed circuit board, here PCB 102, a plurality of device packages 201 mounted to the PCB 102, and a plurality of coolant lines 108 fluidly coupling each of the device packages 201 and to a coolant source 110. It is contemplated that coolant may be delivered to each of the device packages 201 in any desired fluid phase, e.g., liquid, vapor, gas, or combinations thereof and may flow out from the device package 201 in the same phase or a different phase. In some embodiments, the coolant is delivered to the device package 201 and returned therefrom as a liquid and the coolant source 110 may comprise a heat exchanger or chiller to maintain the coolant at a selected temperature. In other embodiments, the coolant may be delivered to the device packages 201 as a liquid, vaporized to a liquid within the device package, and returned to the coolant source 110 as a vapor. In those embodiments, the device packages 201 may be fluidly coupled to the coolant source 110 in parallel and the coolant source 110 may include or further include a compressor (not shown) for condensing the received vapor to a liquid form.

Figure 1B:
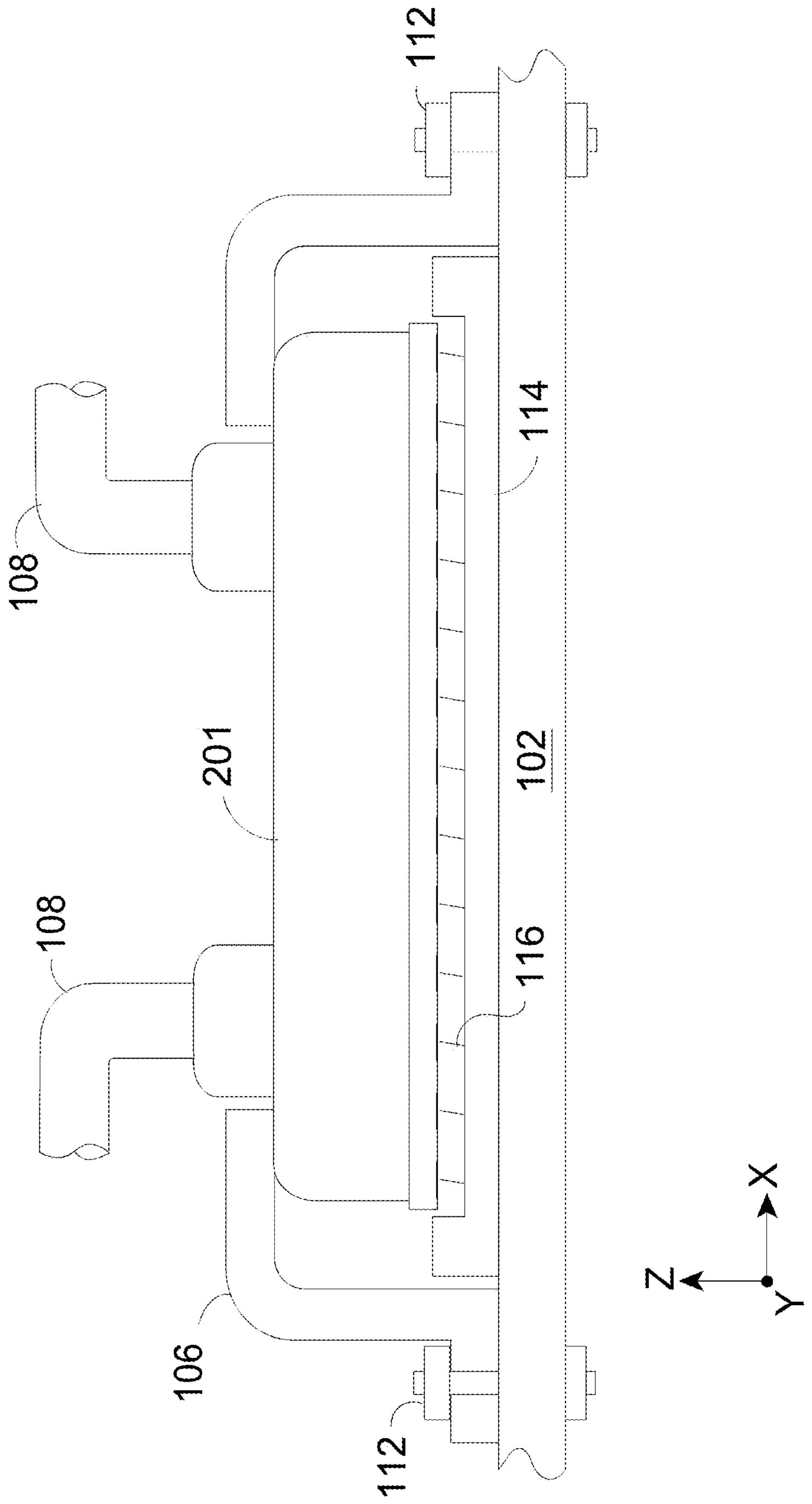
FIG. 1B is a schematic partial sectional side view of a device package mounted on a PCB, in accordance with embodiments of the present disclosure.

FIG. 1B is a schematic partial sectional side view of a portion of the system panel 100 of FIG. 1. As shown, each device package 201 is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame 106 and a plurality of fasteners 112, e.g., compression screws, collectively configured to exert a relatively uniform downward force on the upward facing edges of the device package 201. The uniform downward force ensures proper pin contact between the device package 201 and the socket 114.

Figure 2A:
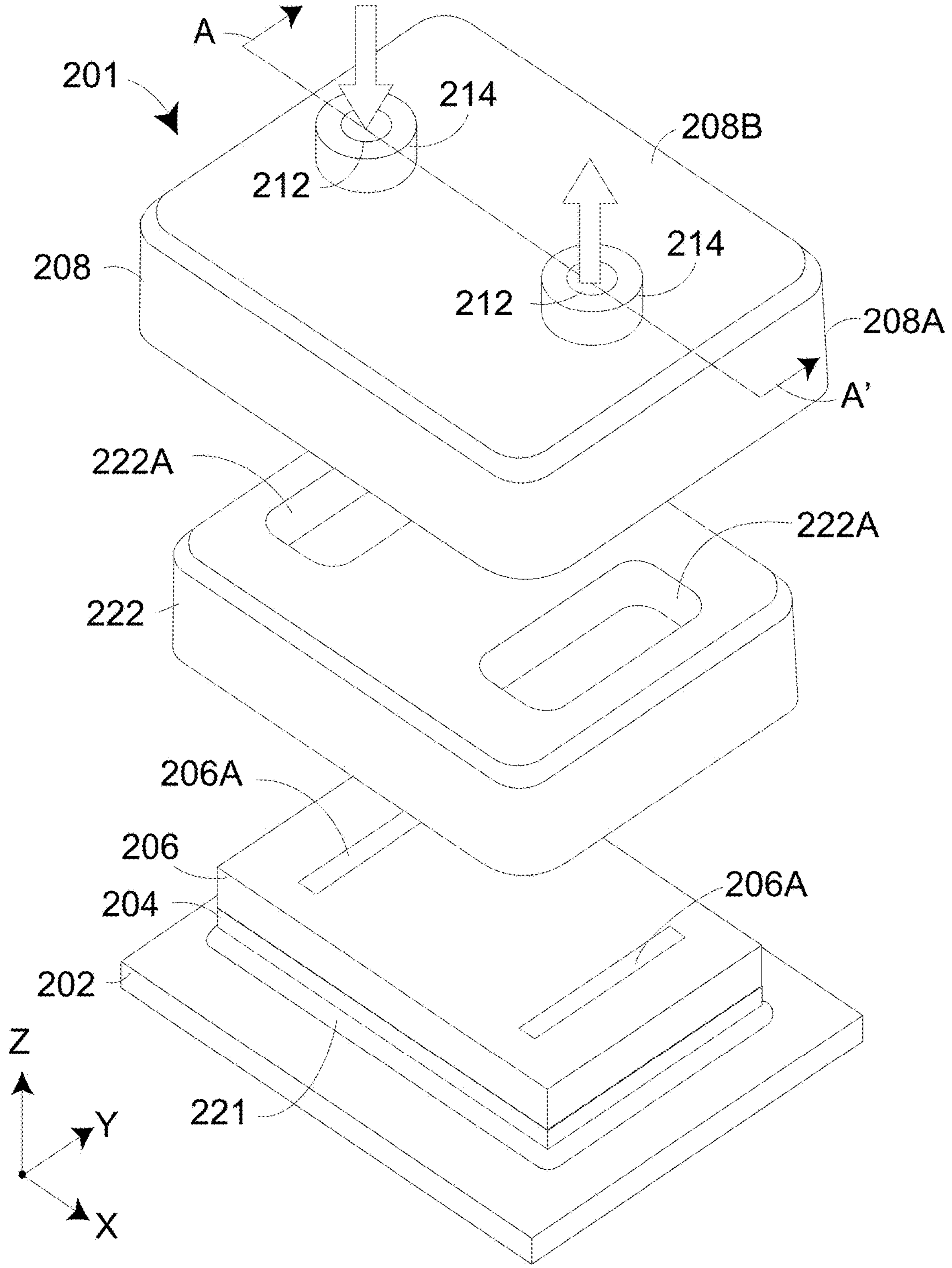
FIG. 2A is a schematic exploded isometric view of the device package in FIG. 1B.
Figure 2B:
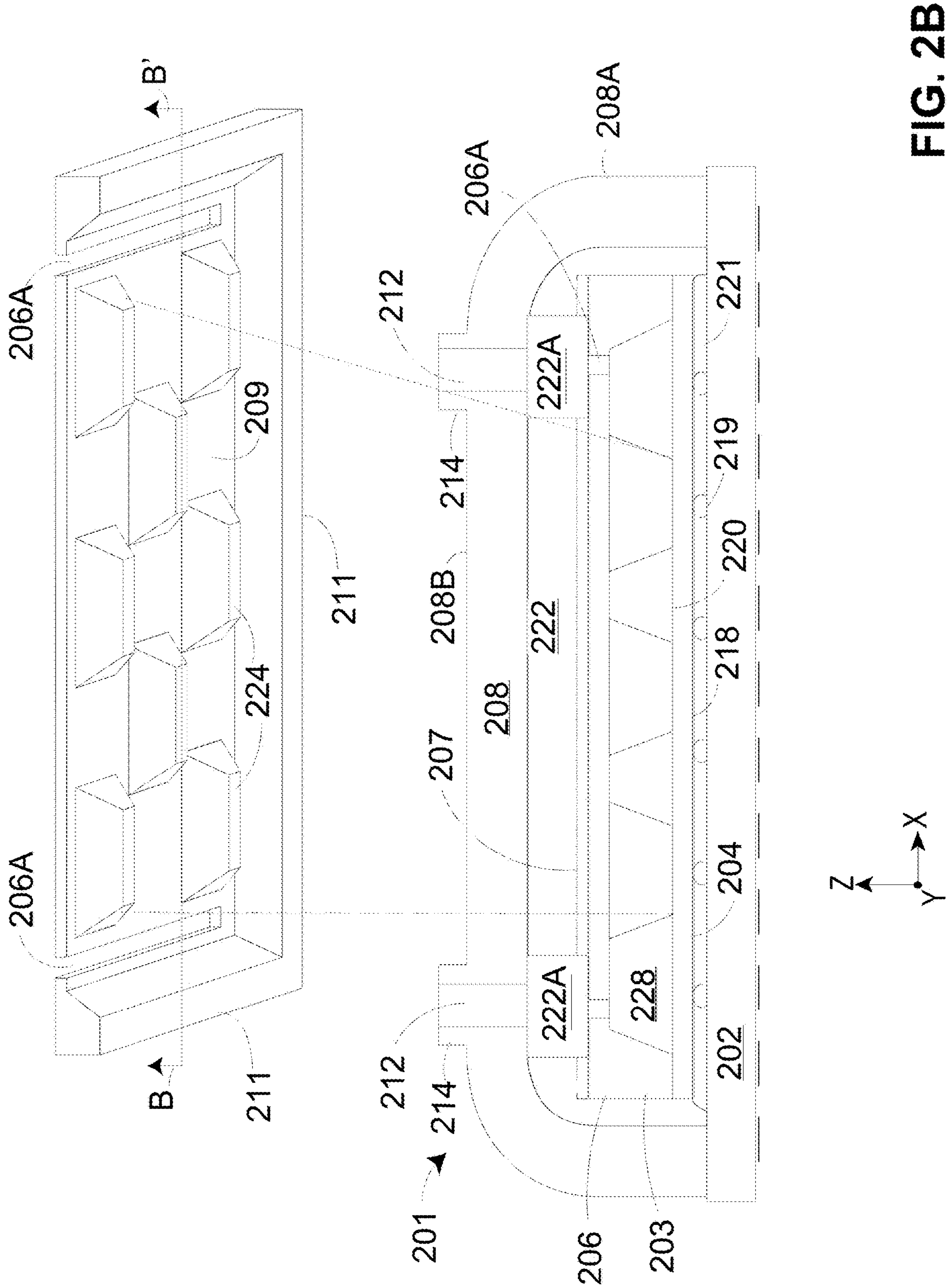
FIG. 2B shows schematic sectional side and isometric views of the device package of FIG. 1B.

FIG. 2A is a schematic exploded isometric view of an example device package 201, in accordance with embodiments of the present disclosure. FIG. 2B is a schematic sectional view of the device package 201 taken along line A-A' of FIG. 2A. Generally, the device package 201 includes a package substrate 202, an integrated cooling assembly 203 (as shown in FIG. 2B) disposed on the package substrate 202, and a package cover 208 disposed on a peripheral portion of the package substrate 202. The package cover 208 extends over the integrated cooling assembly 203 so that the integrated cooling assembly 203 is disposed between the package substrate 202 and the package cover 208. As shown, the device package 201 further includes a sealing material layer 222 that forms a coolant impermeable barrier between the package cover 208 to the integrated cooling assembly 203. Coolant is delivered to the integrated cooling assembly 203 via inlet/outlet openings 212 in the package cover 208 and corresponding openings 222A formed through the sealing material layer 222. In some embodiments, the device package 201 may further include a support member 207 (shown in phantom in FIG. 2B) attached to the integrated cooling assembly 203.

Generally, the package substrate 202 includes a rigid material, such as an epoxy or resin-based laminate, that supports the integrated cooling assembly 203 and the package cover 208. The package substrate 202 may include conductive features disposed in or on the rigid material that electrically couple the integrated cooling assembly 203 to a system panel, such as the PCB 102.

The integrated cooling assembly 203 typically includes a semiconductor device, here device 204, and a cold plate 206 bonded to the device 204. Here, the device 204 includes an active side 218 that includes device components, e.g., transistors, resistors, and capacitors, formed thereon or therein, and a non-active side, here the device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the device 204 and the package substrate 202. The first underfill layer 221 may comprise a cured polymer resin or epoxy, which provides mechanical support to the conductive bumps 219 and protects against thermal fatigue.

The cold plate 206 generally includes a patterned side that faces towards the device 204 and an opposite side that faces towards the package cover 208. The patterned side includes a device facing cavity comprising a base surface 209, sidewalls 211 that surround the base surface 209, and a plurality of support features 224 disposed inwardly of the sidewalls 211. For example, the support features 224 may include protruding features extending away from the base surface 209. In some embodiments, the support features 224 may comprise protruding features having a width that traverses along the base surface 209. For example, one or more of the support features 224 may extend from a first opening of the inlet/outlet openings 212 to a second opening of the inlet/outlet openings 212 (e.g., starting from proximate to the right side of the left opening 212 and ending from proximate to the left side of the right opening 212). When attached to the device 204 disposed therebelow, the base surface 209 forms the upper surface of a coolant channel 228, the sidewalls 211 form an inner perimeter of the coolant channel 228, and the device backside 220 forms the bottom of the coolant channel 228. Thus, the device backside 220 is in direct thermal contact with coolant flowed therethrough. Generally, the support features 224 extend from the base surface 209 to a bonding interface with the device backside 220. The support features 224 provide structural support to the integrated cooling assembly 203 and disrupt laminar fluid flow at the interface of the coolant and the device backside 220 resulting in increased heat transfer therebetween.

Here, coolant is circulated through the coolant channel 228 through openings disposed through the cold plate 206, shown here as openings 206A disposed between the downwardly facing base surface 209 and an opposite upwardly facing surface. The openings 206A are in fluid communication with the inlet/outlet openings 212 of the package cover 208 through openings 222A formed in the sealing material layer 222 disposed therebetween.

As described in the methods below, in some embodiments, the cold plate 206 may be patterned using an anisotropic etch process that causes surfaces of the sidewalls and the support features 224 to slope, e.g., to form an angle of less than 90° with the bonding surface of the device 204. The anisotropic etch process causes the support features 224 to have a trapezoidal shape in cross section where each of the support features 224 is wider at the base surface 209 than at its interface with the device 204. Similarly, the sidewalls slope away from the base surface 209 and are wider at their base than at the interface with the device 204. In some embodiments, the support features 224 do not have sloped sidewalls but vertical side walls. For example, the support features 224 may have a rectangular shape in cross section.

The sloped surface desirably increases the stability of the sidewalls 211 and support features 224 during manufacturing of the integrated cooling assembly 203. The added stability allows for the width of the field surfaces of the sidewalls 211 to be narrower, and the coolant channels to be deeper, when compared to cold plates having orthogonal surfaces, as narrow features at the base may undesirably buckle and break as the aspect ratio (height to width ratio) thereof is increased.

Here, the cold plate 206 is directly bonded to the device backside 220, i.e., attached to the device backside 220 without the use of an intervening adhesive material and the cold plate 206 the device backside 220 are in direct thermal contact. The package cover 208 generally comprises one or more vertical or sloped sidewall portions 208A and a lateral portion 208B that spans and connects the sidewall portions 208A. The sidewall portions 208A extend upwardly from a peripheral surface of the package substrate 202 to surround the device 204 and the cold plate 206 disposed thereon. The lateral portion 208B is disposed over the cold plate 206 and is typically spaced apart from the cold plate 206 by a gap corresponding to the thickness of the sealing material layer 222. Coolant is circulated through the coolant channel 228 through the inlet/outlet openings 212 formed through the lateral portion 208B. In each of the embodiments described herein, coolant lines 108 may be attached to the device package 201 by use of connector features formed in the package cover 208, such as threads formed in the sidewalls of the inlet/outlet openings 212 and/or protruding features 214 that surround the openings 212 and extend upwardly from a surface of the lateral portion 208B.

Typically, the package cover 208 is formed of semi-rigid or rigid material so that at least a portion of the downward force exerted on the package cover 208 by the mounting frame 106 (FIG. 1) is transferred to the supporting surface of the package substrate 202 and not transferred to the cold plate 206 and the device 204 therebelow. In some embodiments, the package cover 208 is formed of a thermally conductive metal, such as aluminum or copper. In some embodiments, the package cover 208 functions as a heat spreader that redistributes heat from one or more electronic components within a multi-component device package, such as described below.

The sealing material layer 222 forms an impermeable barrier between the integrated cooling assembly 203 and the package cover 208 that prevents coolant from reaching the active side 218 of the device 204 and causing damage thereto. In some embodiments, the sealing material layer 222 comprises a polymer or epoxy material that extends upwardly from the package substrate 202 to encapsulate and/or surround at least a portion of the device 204. In other embodiments, the sealing material layer 222 may be disposed between only the upward facing surface of the cold plate 206 and the portion of the package cover 208 disposed thereover. In some embodiments, the sealing material layer is formed from a molding compound, e.g., a thermoset resin, that when polymerized, forms a hermetic seal between the package cover 208 and the cold plate 206. Here, coolant is delivered to the cold plate 206 through openings 222A disposed through the sealing material layer 222. As shown, the openings 222A are respectively in registration and fluid communication with the inlet/outlet openings 212 of the package cover 208 thereabove and the inlet/outlet openings 206A in the cold plate 206 therebelow. Typically, coolant lines 108 are attached to the device package 201 by use of connector features formed in the package cover 208, such as threads formed in the sidewalls of the inlet/outlet openings 212 and/or protruding features 214 that surround the inlet/outlet openings 212 and extend upwardly from the surface of the lateral portion 208B.

Beneficially, the sealing material layer 222 provides mechanical support that improves system reliability and extends the useful lifetime of the device package 201. For example, the sealing material layer 222 may reduce mechanical stresses that can weaken interfacial bonds and/or electrical connections between electrical components of the device package 201, such as stresses caused by vibrations, mechanical and thermal shocks, and/or fatigue caused by repeated thermal cycles. In some embodiments, the sealing material layer 222 may be a thermally conductive material, such as a polymer or epoxy having one or more thermally conductive additives, such as solder (e.g., In), silver, graphite, and/or other forms of carbon (e.g., graphene or carbon nanoparticles). In some embodiments, the device package 201 further includes a support member 207 attached to the upward-facing side of the cold plate 206, the support member 207 may be formed of a rigid material, e.g., a metal or ceramic plate, that provides mechanical support to the cold plate 206. The support member 207 may be attached to the cold plate 206 using a direct bonding method or by use of an intervening adhesive layer (not shown).

Figure 2C:
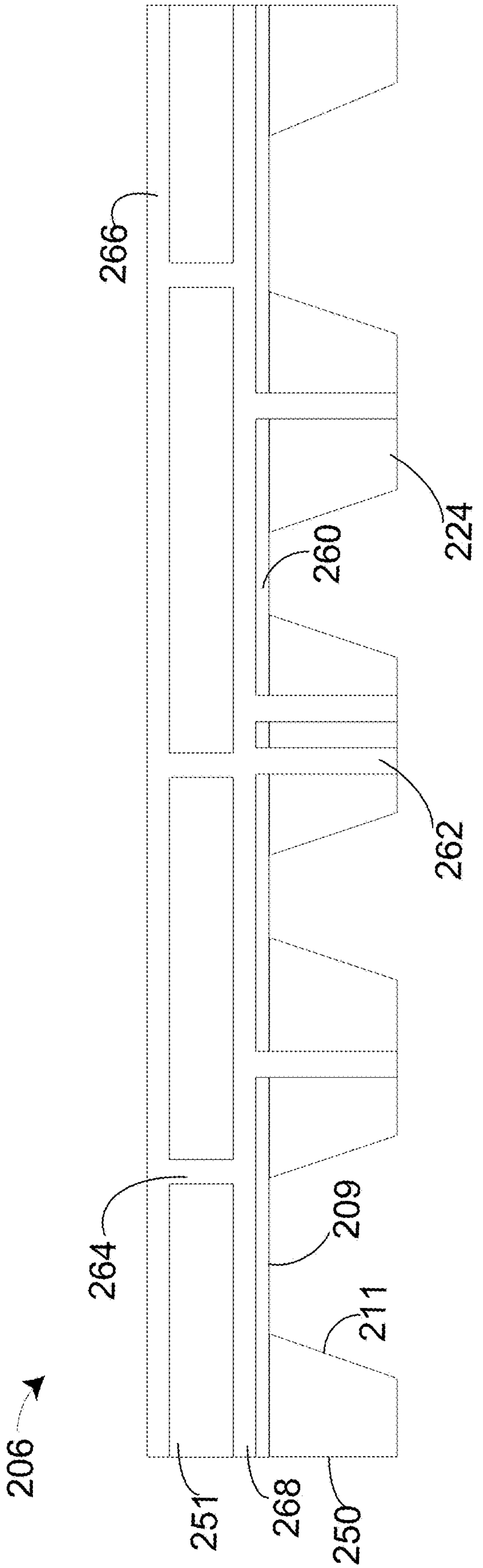
FIG. 2C is a schematic sectional side view of FIG. 2B taken along line B-B.

FIG. 2C is a schematic sectional side view of the cold plate 206 taken along line B-B of FIG. 2B. As shown, the cold plate 206 has a first side and a second side opposite the first side. The first side has a base surface 209, a support feature 224 that extends downwardly from the base surface 209, and sidewalls 211 that extend downwardly from the base surface 209. The sidewalls 211 may surround the base surface 209 and the support feature 224. In some embodiments, the first side includes a dielectric layer 260 (e.g., for protecting the cold plate 206 and/or direct dielectric bonding of the support feature 224). In some embodiments, the cold plate 206 includes a first interconnect 262 vertically disposed through the support feature 224, where the first interconnect 262 is electrically coupled to the semiconductor device 204 through direct hybrid bonds formed between the cold plate and the semiconductor device 204. In some embodiments, the first side of the cold plate and the backside of the semiconductor device define a coolant channel 228 therebetween.

In some embodiments, a plurality of stacked and bonded layers collectively forms the cold plate 206. The cold plate 206 comprises layers 250, 251 (e.g., a base layer, a substrate). In some embodiments, the layer 251 comprises a second interconnect 264 vertically disposed therethrough, and the first and second interconnects 262, 264 are electrically coupled through direct hybrid bonds formed between the support feature 224 and the layer 251. In some embodiments, the sides of the cold plate 206 comprise one or more conductive planes 266, 268. For example, the conductive planes 266, 268 may include a power plane and/or a ground plane. In some embodiments, the first interconnect 262 connects the semiconductor device 204 to the conductive planes 266, 268. The cold plate may include a power/ground delivery network. The conductive planes 266, 268 and the interconnects 262, 264 may be part of the PDN. In some embodiments, the cold plate 206 comprises a layer attached to the support feature 224, for example, in a closed cavity configuration as described with respect to FIG. 7. In some embodiments, the support feature decreases in width from the base surface to the bonding interface of the cold plate and the semiconductor device. The sidewalls 211 of the cold plate 206 may be perpendicular with respect to the first side, meeting the base surface 209 at an angle equal to 90 degrees. In some embodiments, the sidewalls of the cold plate are sloped. For example, the sidewalls 211 may slope away from the semiconductor device backside at an angle less than 90 degrees. In another non-limiting example, the sidewalls 211 slope away from the semiconductor device at an angle greater than 90 degrees. In a third, non-limiting example, the sidewalls 211 slope away from the semiconductor device at an angle greater than 115 degrees.

It is contemplated that the integrated cooling assemblies described herein may incorporate one more features of any one of the cooling assemblies or may be formed by any one or combination of the methods set forth in U.S. Provisional Application 63/456,415, filed Mar. 31, 2023, which is incorporated by reference herein in its entirety. For example, an integrated cooling assembly may comprise a PDN and a signal redistribution network. A device may be coupled to one or both of the PDN and signal redistribution network without departing from the teachings of the present disclosure. In some embodiments, a method of forming the integrated cooling assembly includes forming one or more segments of the first interconnect prior to direct hybrid bonding the first layers. In some embodiments, the method includes, after direct hybrid bonding the first layers, patterning the first side to form the base surface, sidewalls, and support feature. In some embodiments, the method includes, prior to direct hybrid bonding the first layers, patterning each of the first layers to form respective portions of the sidewalls and support feature.

Figure 3:
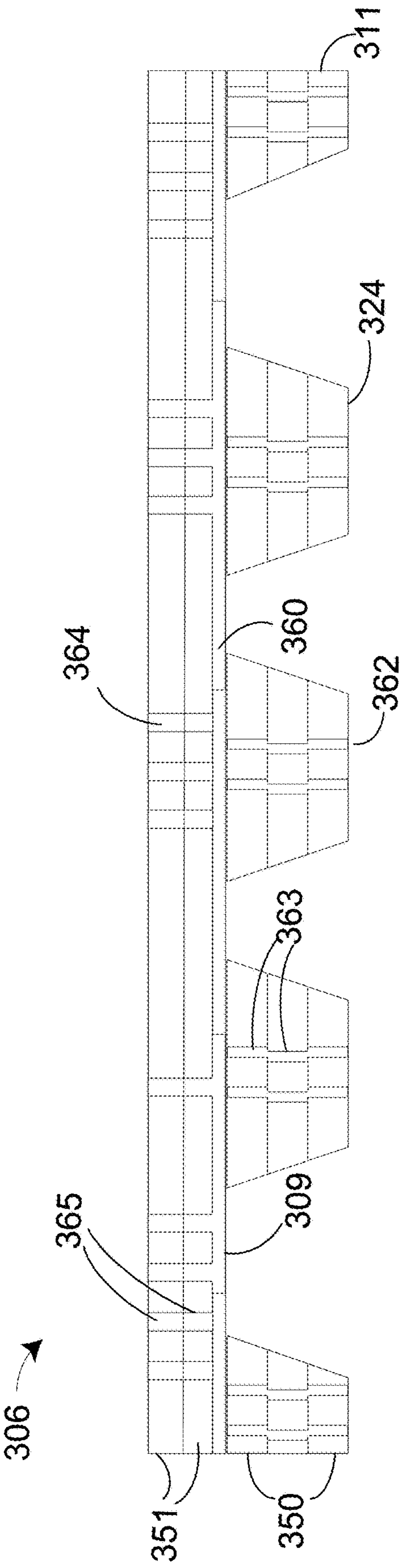
FIGS. 3-4 are schematic sectional views of cold plates comprising a signal redistribution network, in accordance with some embodiments of the present disclosure.
Figure 4:
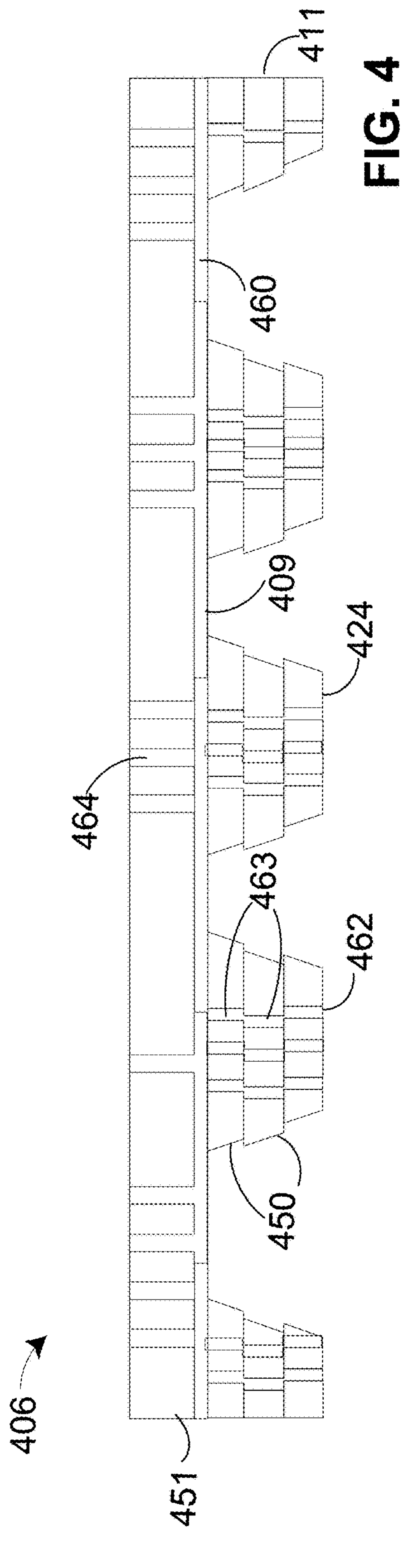

One or more components of a cold plate of an integrated cooling assembly may include a plurality of stacked and/or bonded layers having conductive portions that collectively form a signal redistribution network. FIGS. 3-4 are schematic sectional views of cold plates 306, 406 comprising a signal redistribution network in accordance with some embodiments of the present disclosure. The cold plates 306, 406 may include one or more parts that correspond to the cold plate 206. For example, as shown at FIG. 3, the cold plate 306 comprises a first side (e.g., a frontside) and a second side (e.g., a backside). The first side of the cold plate 306 has a base surface 309, one or more support features 324, and sidewalls 311 respectively corresponding to base surface 209, support feature 224, and sidewalls 211. Analogously, the first side of the cold plate 406 may include a base surface 409, one or more support features 424, and sidewalls 411. It is understood and appreciated that various aspects described in the following paragraphs about the cold plate 306 would be analogous to the cold plate 406.

The first side may include a dielectric layer 360 (or dielectric layer 460) corresponding to the dielectric layer 260. The cold plate 306 includes a first interconnect 362 vertically disposed through the support features 324. The first interconnect 362 may also be referred to as a thru interconnect. In some embodiments, the plurality of stacked and bonded layers comprises a stack of first layers 350 that forms at least one of the support features 324. In some embodiments, the plurality of stacked and bonded layers comprises at least one second layer 351 comprising a second interconnect 364 (or interconnect 464). The second interconnect 364 may also be referred to as a thru-substrate interconnect. In some embodiments, each of the first side and the second side of the cold plate 306 may comprise a respective conductive plane (not shown) analogous to conductive planes 266, 268. The first interconnect 362 coupled to the second interconnect 364 form a signal redistribution network of the cold plate 306. In some embodiments, the signal redistribution network of the cold plate 306 includes the conductive planes of the respective sides of the cold plate 306 (e.g., such as conductive planes 266, 268).

The first interconnect 362 may be electrically coupled to a semiconductor device (e.g., via direct hybrid bonds). Each of the first layers 350 comprises a segment 363 of the first interconnect 362, and each segment of the first interconnect is connected to another vertically adjacent segment of the first interconnect through direct hybrid bonds formed between the first layers 350. The second interconnect may be electrically coupled to the first interconnect through direct hybrid bonds formed between the stack of first layers and the second layer. As an illustrative example, the segments 363 of the first interconnect 362 contiguously extend downwardly through the support feature 324 and end at a base of the support feature 324 for direct bonding to conductive pads of a semiconductor device. For example, a segment 363 at the base of the support feature may be exposed for the direct bonding. For example, a segment 363 at the base of the support feature may have a dielectric material surrounding one or more sides of segment 363 for hybrid bonding. In some embodiments, the segments 363 may be aligned with a tolerance range up to 50% for forming the first interconnect 362. The first layers 350 may be modified (e.g., shifted, positioned) during stacking and before bonding the first layers 350 to reduce misalignment of the segments 363.

In some embodiments, the second layer 351 may include a base layer, such as a substrate, for supporting the formation of the sides of the cold plate. As shown at FIG. 3, the cold plate 306 includes the second layer 351 having a bonded layer stack, where each layer comprises respective interconnect segments 365 that collectively form the second interconnect 364. In some embodiments, the bonded layer stack comprises a rigid material for providing structural support. For example, a first portion of the second layer 351 may comprise structural Si. Additionally, or alternatively, one or more portions of the second layer 351 may comprise device components, integrated circuitry, etc. The sidewalls 311 may surround the base surface 309 and extend downwardly therefrom to define a cavity. The support features 324 may be disposed in the cavity. The first side of the cold plate 306 may be attached to the device backside to define a coolant channel therebetween including the cavity. In some embodiments, the cold plate 306 comprises a dielectric layer between a conductive layer and the base layer for a respective side. For example, the first side may comprise a dielectric layer on the base layer and a conductive layer on the dielectric layer. It is contemplated that the interconnects 362, 364 may comprise any number of respective segments 363, 365 without departing from the teachings of the present disclosure.

The support feature may be attached to the cold plate using one or more adhesion techniques (e.g., dielectric bonding, hybrid bonding, adhesive, solder, etc.). The cold plate may be attached to a side of the device (e.g., via direct bonding, hybrid bonding, etc.). For example, sidewalls and/or a support feature of the cold plate may be attached to the device to define a perimeter of a coolant channel between the base surface and the backside of the device. For example, the sidewalls and the support feature may be attached to the device through direct dielectric bonds. For example, the sidewalls and the support feature may be attached to the device using an adhesive layer or solder. The first interconnect through the support feature may be connected to the device via direct bonding. For example, the first interconnect may be connected to a signal via of the device through direct hybrid bonds.

In some embodiments, the first layers 350 and/or the second layer 351 may comprise one or more redistribution layers therebetween. For example, a redistribution layer may be disposed between two layers of the first layers 350 such that segments of the first interconnects 362 are connected through the redistribution layer. As a non-limiting example, each of the two layers may be bonded to the redistribution layer, thereby forming connections between respective segments of the two layers through the redistribution layer. In one embodiment, each of the two layers is directly bonded to the redistribution layer. As a second non-limiting example, a redistribution layer may be disposed between two layers of a layer stack (e.g., the second layer 351). Respective segments of the two layers may be connected by the redistribution layer, for example, through hybrid bonds formed between a layer of the two layers and the redistribution layer.

In some embodiments, conductive layers at the second layer 351 are coupled using one or more thru-substrate interconnects (e.g., conductive vias). For example, a first side of the cold plate 306 may comprise a first conductive plane. A second side of the cold plate 306 may comprise a second conductive plane. The thru-substrate interconnects may electrically connect the first conductive layer and the second conductive layer through the second layer 351. In some embodiments, one or more conductive layers of the cold plate 306 may comprise a metallized component and/or be at least partially formed using a metallization process.

One or more layers of the plurality of stacked and bonded layers may have different dimensions than another layer of the plurality of stacked and bonded layers (e.g., widths, heights, lengths, thickness, etc.). In some embodiments, interconnect segments 363 of the one or more layers of the bonded layer stack may have different dimensions, spacing, etc. than an interconnect segment of another layer. For example, starting from a first side (e.g., near the base surface 309) of the support feature 324, the interconnect segments 363 may have progressively narrower lateral width and/or finer pitch until a second, opposing side of the support feature 324 (e.g., near a semiconductor device such as the device 204). As an illustrative example, a first layer of the stack may have dimensions (e.g., lateral sizes, vertical thickness) between about 5 mm and about 0.1 mm, such as about 5 mm or less or about 0.1 mm or greater. For example, the first layer may have a width between about 0.2 mm and 0.8 mm, such as about 0.6 mm and a thickness of between about 0.5 mm and about 0.5 mm, such as about 0.2 mm. A pitch of the first layer's interconnects may be less than 1 mm, such as about 0.5 mm or less, about 0.25 mm or less, about 0.1 mm or less, or about 0.005 or less (e.g., about 0.006 or less). The second layer in the stack (e.g., the succeeding layer) may have dimensions between about 5 mm and about 0.1 mm, such as about 5 mm or less or about 0.1 mm or greater. For example, the second layer may have a width between about 0.2 mm and 0.8 mm, such as about 0.5 mm, and a thickness between about 0.5 mm and about 1 mm, such as about 0.3 mm. A pitch of the second layer's interconnects may be less than 1 mm, such as about 0.5 mm or less, about 0.1 mm or less, about 0.005 or less, or about 0.001 or less (e.g., about 0.003 mm or less). In some embodiments, a thru-substrate interconnect may have a greater lateral size (e.g., width, area, etc.) than an interconnect vertically disposed through a support feature (thru-interconnect). For example, the interconnect 364 may have a lateral cross sectional area between about 1 $mm^2$ and about 0.005 $mm^2$, for example, between about 0.007 $mm^2$ and 0.3 $mm^2$, such as about 0.1 $mm^2$, and the interconnect 362 at the support feature 324 may have segments 363 of a lateral cross sectional area between about 0.7 $mm^2$ and about 0.001 $mm^2$, for example, between about 0.003 $mm^2$ and 0.2 $mm^2$, such as about 0.0064 $mm^2$. In some embodiments, a layer in the stack may have dimensions proportional to the dimensions of the preceding layer in the stack (e.g., same lateral sizes, finer pitch, greater thickness, etc.). In some advantageous aspects, a support feature comprising a layer stack may provide interconnects at varying pitch (e.g., progressively reducing from large pitch interconnects at a backside of the cold plate to fine pitch interconnects at the interface with a device). It is understood that the example dimensions provided herein are intended to be illustrative and non-limiting. It is contemplated that the layers and interconnects may have other dimensions depending on the implementation.

In some embodiments, the support feature 324 comprises a plurality of interconnect segments. The plurality of interconnect segments 363 forms a signal redistribution network or a part thereof that is communicatively coupled to input/output (I/O) features of the semiconductor device through direct hybrid bonds formed therebetween. The first layers 350 and/or the second layer 351 may have openings that are at least partially filled to form the interconnect segments. For example, one or more of the first layers 350 may have openings prior to bonding the first layers. A conductive material (e.g., Cu) may be deposited in the openings to form the interconnect segments of each first layer. The first layers 350 are stacked, aligned, and/or bonded to connect the interconnect segments 363. In some embodiments, one or more coatings (e.g., diffusion barrier layer, etc.) is deposited in the openings prior to depositing the conductive material. In some embodiments, the plurality of interconnect segments has a pitch of about 40 um or less, such as about 35 um or less, such as about 30 um or less, such as about 25 um or less, such as about 20 um or less, such as about 15 um or less, such as about 10 um or less, or such as about 5 um or less.

The cold plate 406 comprises analogous features as the cold plate 306 with some differences. For example, the layer 451 may be a single base layer (e.g., a substrate, wafer, etc.) for supporting the formation of the cold plate. The cold plate 406 may comprise finer pitch interconnects (e.g., interconnect 462) than the cold plate 306. Analogous to the interconnect 362, the interconnect 462 may be formed as a plurality of layers 450, each having interconnect segments (e.g., interconnect segments 463). The layers 450 may be stacked and bonded to connect the respective interconnect segments.

Figure 5:
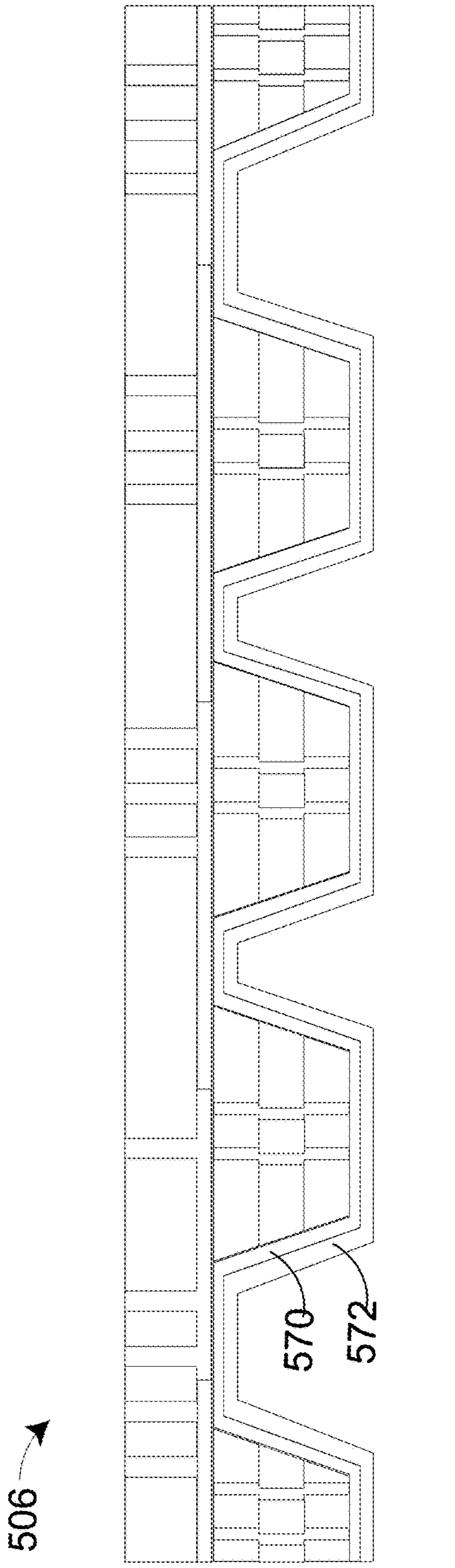
FIG. 5 is a schematic sectional view of a cold plate having additional layers around the support features, in accordance with some embodiments of the present disclosure.

FIG. 5 shows a schematic sectional view of a cold plate 506 having layers 570, 572 around the support features, in accordance with some embodiments of the present disclosure. The layers 570, 572 may be formed on a side of the cold plate 506 (e.g., the frontside) or portions thereof. It is noted that layer 570, 572 are described as separate layers for illustrative purposes and is intended to be non-limiting. For example, the layers 570, 572 may be part of a single coating disposed on the cold plate 506 as described with respect to FIGS. 6-7.

The cold plate 506 comprises a plurality of support features (e.g., support features 324) having respective interconnects (e.g., interconnect 362) disposed therethrough. The respective interconnects may couple a device to the signal redistribution network of the cold plate 506. In some embodiments, the cold plate 506 comprises one or more conductive layers disposed on the base surface (e.g., base surface 309) and/or sides of the support features. For example, the layer 570 may comprise a metal or other conductive material. For example, the layer 570 may be a metallization layer. The layer 570 may form a conductive plane for coupling the signal redistribution network with multiple devices. The interconnect 362 may extend through the support feature to contact with the layer 570. In some embodiments, the layer 570 is disposed at selected support features of the side of the cold plate 506 to provide a plurality of contact points for coupling the signal redistribution network with selected devices.

In some embodiments, the layer 572 may be a protective layer disposed on the base surface (e.g., base surface 309) and/or sides of the support features. For example, the layer 572 may comprise a dielectric, an insulator, or other nonconductive material. For example, the layer 572 may comprise a noncorrosive material for protecting the cold plate 506 (e.g., from a fluid coolant). In such embodiments, the interconnects may extend through the layer 572. In some embodiments, the conductive layer 570 is electrically isolated from a coolant channel (e.g., coolant channel 228) by the layer 572 disposed thereover. A device may be attached and/or bonded (e.g., hybrid bonded) with the cold plate 506 such that the interconnects communicatively couple the device to the signal redistribution network.

Figure 6:
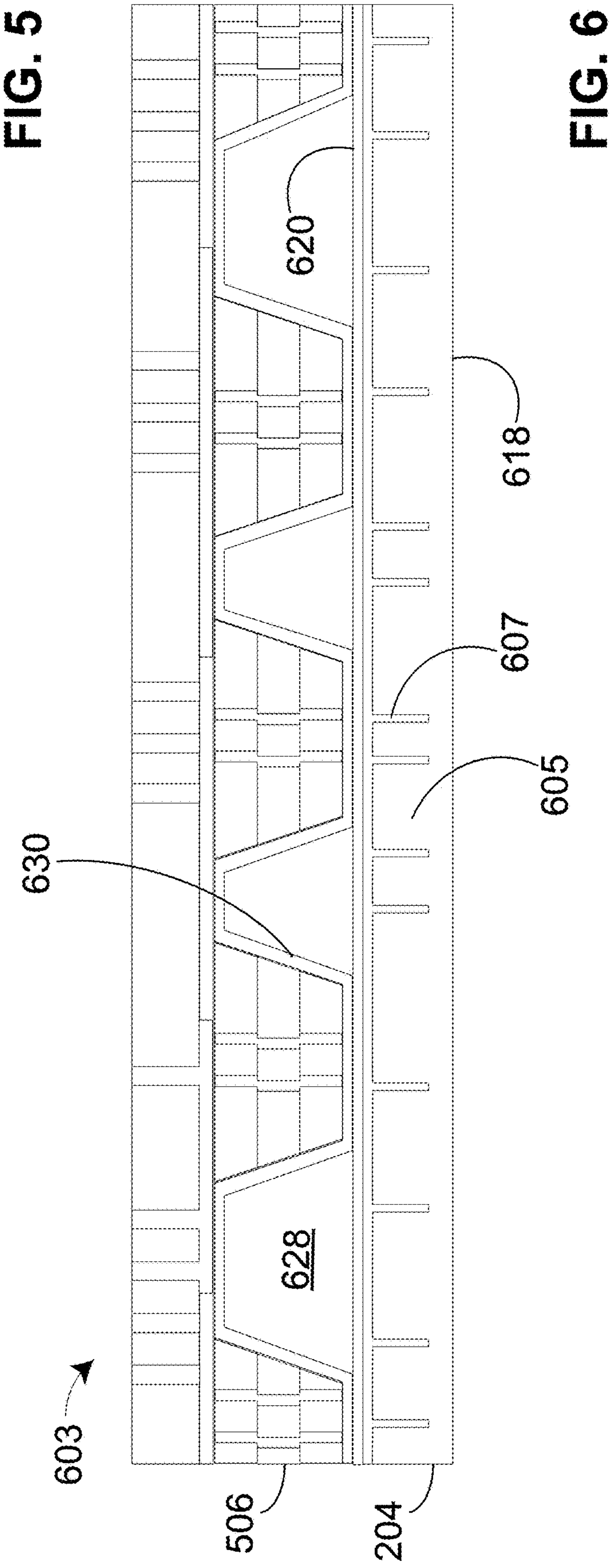
FIG. 6 is a schematic sectional view of an integrated cooling assembly comprising a cold plate coupled to a device in an open cavity configuration, in accordance with some embodiments of the present disclosure.

FIG. 6 shows a schematic sectional view of an integrated cooling assembly 603 comprising a cold plate coupled to a device in an open cavity configuration, in accordance with some embodiments of the present disclosure. In one embodiment, the integrated cooling assembly 603 comprises a device 204 and a cold plate 506. The cold plate 506 and the device 204 are included in the integrated cooling assembly 603 for illustrative purposes and is intended to be non-limiting. It is noted and appreciated that any cold plate and/or device described in the present disclosure may be used.

The device 204 comprises a substrate 605 having an active side 618 and a backside 620 disposed opposite of the active side 618. The device 204 comprises a plurality of vias 607. The vias 607 may be blind vias. For example, the vias 607 may have thermally conductive portions disposed proximate to hot spots of the device 204 (e.g., near logic components of the active side 618). The vias 607 extend downwardly from the backside 620 (e.g., from one or more conductive planes of the backside 620).

The cold plate 506 has a first side and a second side opposite the first side. The first side of the cold plate 506 comprises a recessed side, sidewalls that surround the recessed side and extend downwardly therefrom to define a cavity, and a plurality of support features disposed in the cavity. The plurality of support features has respective interconnects disposed therethrough as part of the signal redistribution network of the cold plate 506. In the open cavity configuration, the cold plate 506 may be attached to the device 204, defining a coolant channel 628 therebetween. In some advantageous aspects, having an open cavity configuration may improve performance of the device 204, for example, by simultaneously cooling components of the device 204 and the conductive lines of the signal redistribution network during the cooling cycle, which may enhance signal communications through the cold plate 506 using the signal redistribution network. At the integrated cooling assembly 603, the backside 620 of the device 204 faces the first side of the cold plate 506. The first side of the cold plate 506 may comprise a protective layer 630. For example, the protective layer 630 may comprise a corrosion-resistant compound for mitigating damage from fluid coolant within the coolant channel 628. In some embodiments, the protective layer 630 may comprise a plurality of layers (e.g., layers 570, 572). An interconnect disposed through a support feature of the cold plate 506 may extend through the protective layer 630 (e.g., through the layer at a bonding interface of the cold plate 506 and the device 204) to connect the signal redistribution network with conductive pads of the device 204 (e.g., at the backside 620).

The device 204 comprises one or more I/O features. In some embodiments, the I/O features of the device 204 comprise through-substrate vias (TSVs). For example, the device 204 may comprises a plurality of signal vias disposed through the device 204 and coupled with the signal redistribution network of the cold plate 506. For example, the device 204 may comprise routing lines that may be coupled with the signal redistribution network of the cold plate 506. In some embodiments, the backside 620 of the device 204 comprises one or more conductive planes and/or redistribution layers. Additionally, or alternatively, the active side 618 of the device 204 may comprise one or more conductive planes. The conductive planes may couple the I/O features of the device 204 to the signal redistribution network of the cold plate 506. As an illustrative example, the device 204 may comprises conductive planes at the active side 618 and the backside 620. TSVs may couple the active side 618 and the backside 620. In this manner, the signal redistribution network of the cold plate 506 may be communicatively coupled to components of the device 204 through the connection with the active side 618. In some embodiments, the device 204 is stacked on a second device or a plurality of devices. The signal redistribution network of the cold plate 506 may be communicatively coupled with the second device through the coupled conductive planes of the device 204.

Figure 7:
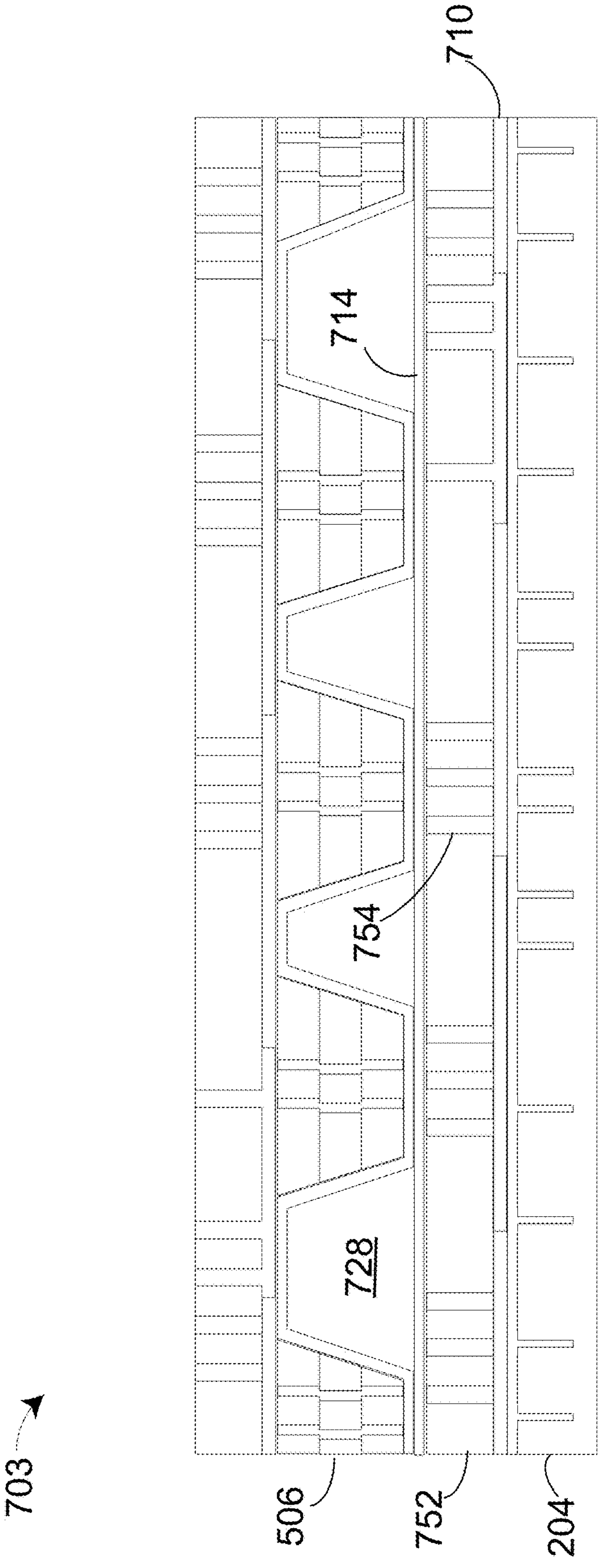
FIG. 7 is a schematic sectional view of an integrated cooling assembly comprising a cold plate coupled to a device in a closed cavity configuration, in accordance with some embodiments of the present disclosure.

FIG. 7 shows a schematic sectional view of an integrated cooling assembly 703 comprising a cold plate 506 coupled to a device 204 in a closed cavity configuration, in accordance with some embodiments of the present disclosure. The integrated cooling assembly 703 comprises a substrate 752. For example, the substrate 752 may comprise structural Si, glass, or another substrate, e.g., comprising organic and/or inorganic material. At the integrated cooling assembly 703, a first side 710 of the substrate 752 is attached to the backside of the device 204. In the closed cavity configuration, the cold plate 506 is attached to a second side 714 of the substrate 752, defining a coolant channel 728 therebetween. The first side 710 and the second side 714 comprise respective conductive planes. The substrate 752 may have openings at which thru-substrate interconnects 754 are disposed therethrough, connecting the first side 710 and the second side 714. In some embodiments, one or both of the sides 710, 714 comprise a bonding layer, for example, to support direct bonding (e.g., using dielectric bonding, hybrid bonding, etc.) between the cold plate 506 and the device 204. In some embodiments, either or both of the sides 710, 714 do not comprise conductive planes, and the interconnects are connected (e.g., using a metal-to-metal bonding technique such as thermocompression bonding). For example, the thru interconnects of the cold plate 506 may extend to the second side 714 and bonded to the thru-substrate interconnects 754 for forming signal lines (e.g., coupling the device 204).

The signal redistribution network of the cold plate 506 may be coupled to the device 204 through the conductive lines at the substrate 752. For example, the thru interconnects of the cold plate 506 may be connected to the conductive plane at the second side 714 through hybrid bonding. In some embodiments, a second device may be attached to another side of the cold plate 506 different from the device 204. The second device may be communicatively coupled to the device 204 through the signal redistribution network of the cold plate 506. For example, signals may be passed between the devices through the connected conductive lines including the thru interconnects of the cold plate 506 and the thru-substrate interconnects 754.

Figure 8:
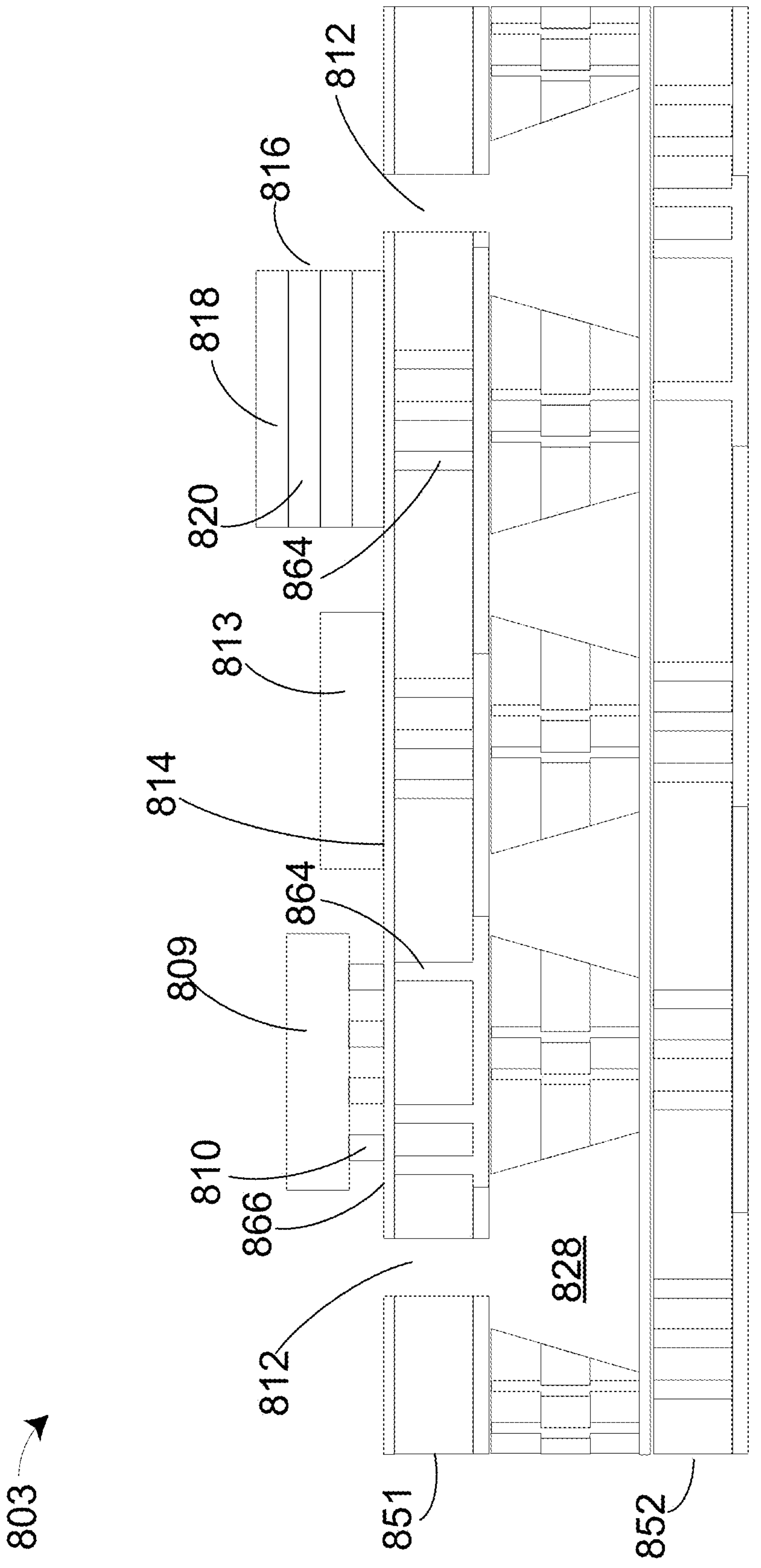
FIGS. 8-9 are schematic sectional views of integrated cooling assemblies comprising a cold plate interposer coupled to a plurality of devices, in accordance with some embodiments of the present disclosure.
Figure 9:
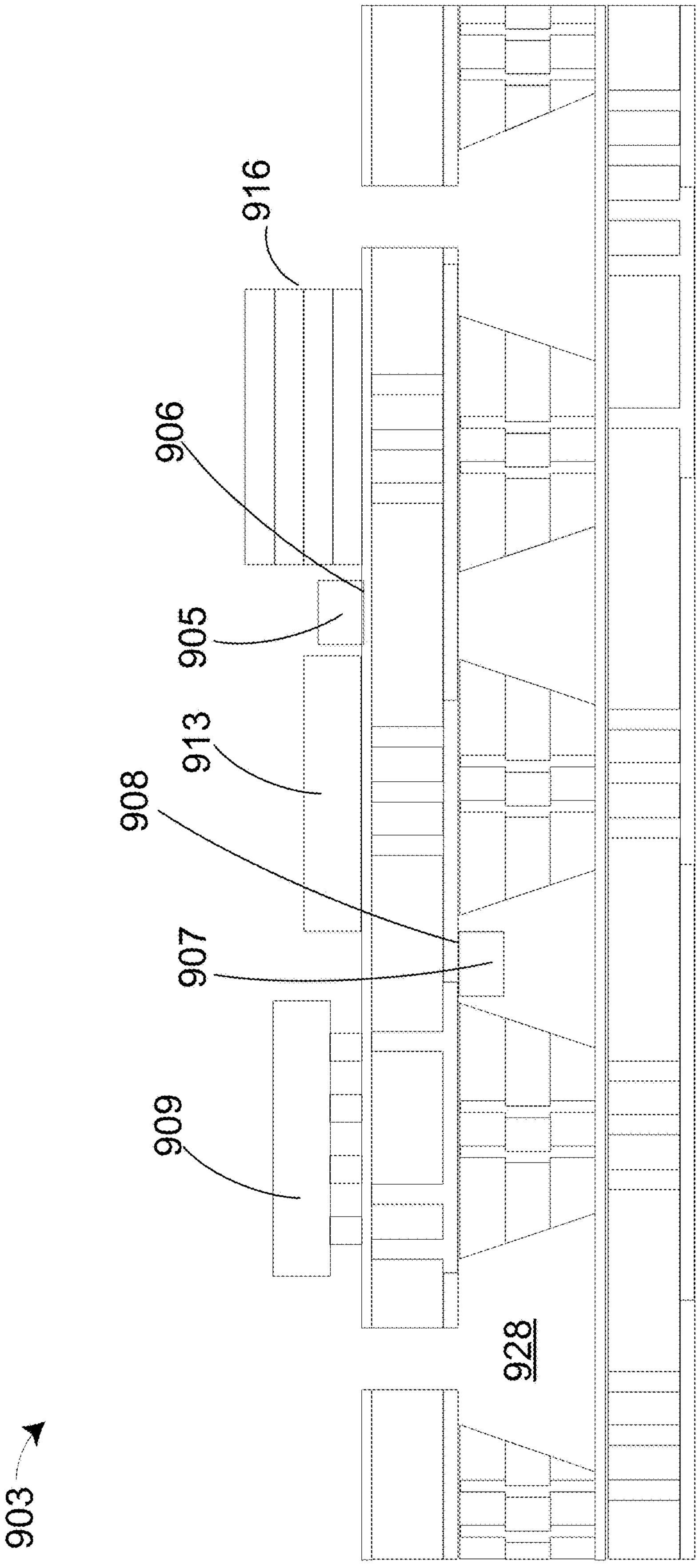

The signal redistribution network may enable a cold plate to function as an interposer. In some embodiments, the integrated cooling assembly comprises a plurality of semiconductor devices communicatively coupled to one another through the interposer. FIGS. 8-9 show schematic sectional views of the integrated cooling assemblies 803, 903 comprising a cold plate interposer (e.g., cold plate interposer 851) coupled to a plurality of devices (e.g., devices 809, 813, 816, 905, 907, 909, 913, 916), in accordance with some embodiments of the present disclosure. In some embodiments, the integrated cooling assemblies 803, 903 comprise a plurality of devices attached to a first side of a cold plate, wherein the cold plate is capable of passing signals between the plurality of devices through the signal redistribution network. A cold plate communicatively coupling the devices may be referred to as a cold plate interposer. In some embodiments, the cold plate interposer 851 comprises a substrate 852, for example, in a closed cavity configuration as described with respect to FIGS. 8-9. In some aspects, the substrate 852 may be analogous to the substrate 752 and may comprise similar components. In this manner, a plurality of devices may be communicatively coupled through the signal redistribution network of a cold plate and cooled without interfering with the inter-device communication (e.g., by running a coolant fluid through the coolant channel).

The cold plate interposer 851 comprises a signal redistribution network and is implemented as an interposer (e.g., a 2.5D interposer) of the integrated cooling assembly 803. A cold plate interposer may have an open cavity configuration or a closed cavity configuration. The cold plate interposer 851 is configured for a closed cavity configuration for illustrative purposes and is intended to be non-limiting. The integrated cooling assemblies 803, 903 have openings (e.g., openings 812). The openings may be used for coupling with a coolant system (e.g., using fluid lines). For example, the integrated cooling assembly 803 may be in fluid communication with a coolant system that passes coolant through the openings 812 and the coolant channel 828. The signal redistribution network of the cold plate interposer 851 is coupled to the plurality of devices 809, 813, and 816, for example, through conductive pads at a side 866 of the cold plate interposer 851 and/or connected to the thru-substrate interconnects 864. In some embodiments, the side 866 comprises one or more conductive layers communicatively coupling the devices 809, 813, and 816. For example, signal communications may pass between the device 809 and the device 816 through a signal path defined by a conductive pad of the side 866 and the interconnects 864. For example, the device 809 may be a logic chiplet, and the device 816 may comprise memory. The logic chiplet may access the memory of the device 816 through the cold plate interposer 851.

The devices may be any device type (e.g., logic, memory, etc.) and combinations thereof. For example, one or more of the devices comprise a logic device, and one or more of the devices comprise a memory device stack. The devices may have different dimensions (e.g., thicknesses, area, form factors, etc.). For example, the devices 809, 813, 909, 913 may be logic devices. In some embodiments, a device (e.g., devices 816, 916) comprises a plurality of vertically stacked layers. For example, the device 816 may comprise a device and/or memory stack. For example, one or more layers of the device 816 may comprise logic components (e.g., uppermost layer 818, a layer adjacent to the side 866, etc.). For example, one or more layers of the device 816 may comprise memory (e.g., layer 820) that is accessible to any other device coupled through the signal redistribution network. In some embodiments, one or more of the devices may be coupled to a PDN and the signal redistribution network. For example, the device 909 may receive power/ground through the PDN and pass data signals to other devices through the signal redistribution network.

The devices may be attached to the cold plate interposer 851 using any suitable technique. For example, the device 809 may be attached to the side 866 using conductive blocks 810, communicatively coupling the cold plate interposer 851 and the device 809. For example, the conductive blocks 810 may comprise solder. In some embodiments, the devices are directly bonded to the cold plate interpose 851. For example, the device 813 may be hybrid bonded to the side 866, forming an interface 814 for passing signals therebetween. As another example, the device 816 may be bonded to the side 866 using dielectric bonding.

In some embodiments, one or more passive devices 905, 907 may be integrated in the integrated cooling assembly. For example, the passive devices 905, 907 may be embedded in the integrated cooling assembly. For example, the passive device 907 may be attached to a base surface of the cold plate interposer and disposed in the coolant channel 928. The device may include a dielectric coating comprising a material that would protect against damage from coolant in a coolant channel. The passive devices 905, 907 are communicatively coupled to the signal redistribution network and/or the plurality of devices. For example, the passive devices 905, 907 may be hybrid bonded to the cold plate interposer 851 at conductive pads of the signal redistribution network, forming an interface (e.g., interfaces 906, 908) through the hybrid bonds. In some embodiments, the integrated passive devices may comprise a protective layer. For example, the device 907 may have an anti-corrosive coating to protect against coolant in the coolant channel 928.

Figure 10:
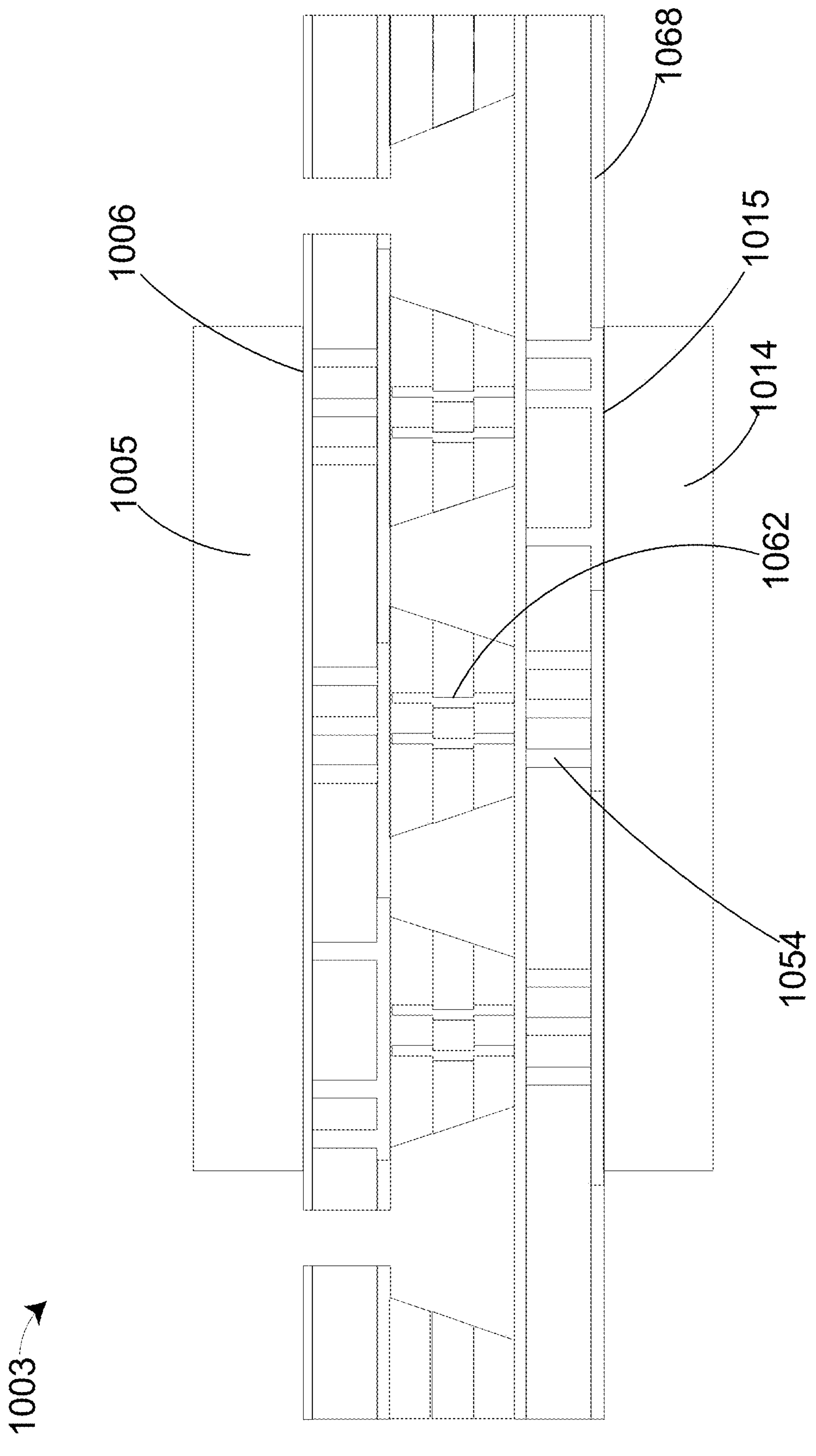
FIG. 10 is a schematic sectional view of an integrated cooling assembly comprising a signal redistribution network coupled to first and second devices at opposing sides of a cold plate, in accordance with some embodiments of the present disclosure.

In some embodiments, the integrated cooling assembly comprises a plurality of devices coupled to the signal redistribution network at different sides of a cold plate interposer (e.g., through direct hybrid bonds formed therebetween). Some of these devices may be bonded to the same side of the interposer in a side-by-side arrangement analogous to FIGS. 8-9. FIG. 10 shows a schematic sectional view of an integrated cooling assembly 1003 comprising a signal redistribution network coupled to devices 1005, 1014 at opposing sides 1006, 1015 of a cold plate interposer, in accordance with some embodiments of the present disclosure. At the integrated cooling assembly 1003, the device 1005 is attached to a backside 1006 of the cold plate interposer. The device 1014 is attached to a frontside 1015 of the cold plate interposer. Each device may have respective connections to the signal redistribution network, for example, formed through hybrids bond therebetween. The device 1005 may comprise a plurality of conductive pads directly bonded to opposing pads on the backside 1006 of the cold plate interposer. In some embodiments, the device 1014 comprises a plurality of conductive vias that are coupled to the signal redistribution network, for example, through the interconnect 1054 and a conductive layer 1068 at the frontside 1015 through hybrid bonding. The device 1005 may communicate with the device 1014 through the signal redistribution network. For example, a signal path may be defined through the pads at the backside 1006 and frontside 1015, thru interconnects 1062, and thru-substrate interconnects 1054. It is contemplated that the signal redistribution network may provide a plurality of signal paths between the devices involving the thru interconnects 1062 and thru-substrate interconnects 1054.

In some embodiments, the devices 1005, 1014 are attached to the respective backside 1006 and front side 1015 of the cold plate interposer using different bonding techniques. Each device has respective connections to the signal redistribution network. For example, the device 1005 may be directly bonded to the backside 1006 through hybrid bonds. For example, the device 1014 may be adhered to the frontside 1015 using a conductive material (e.g., solder, a polymer layer, etc.)

Figure 11:
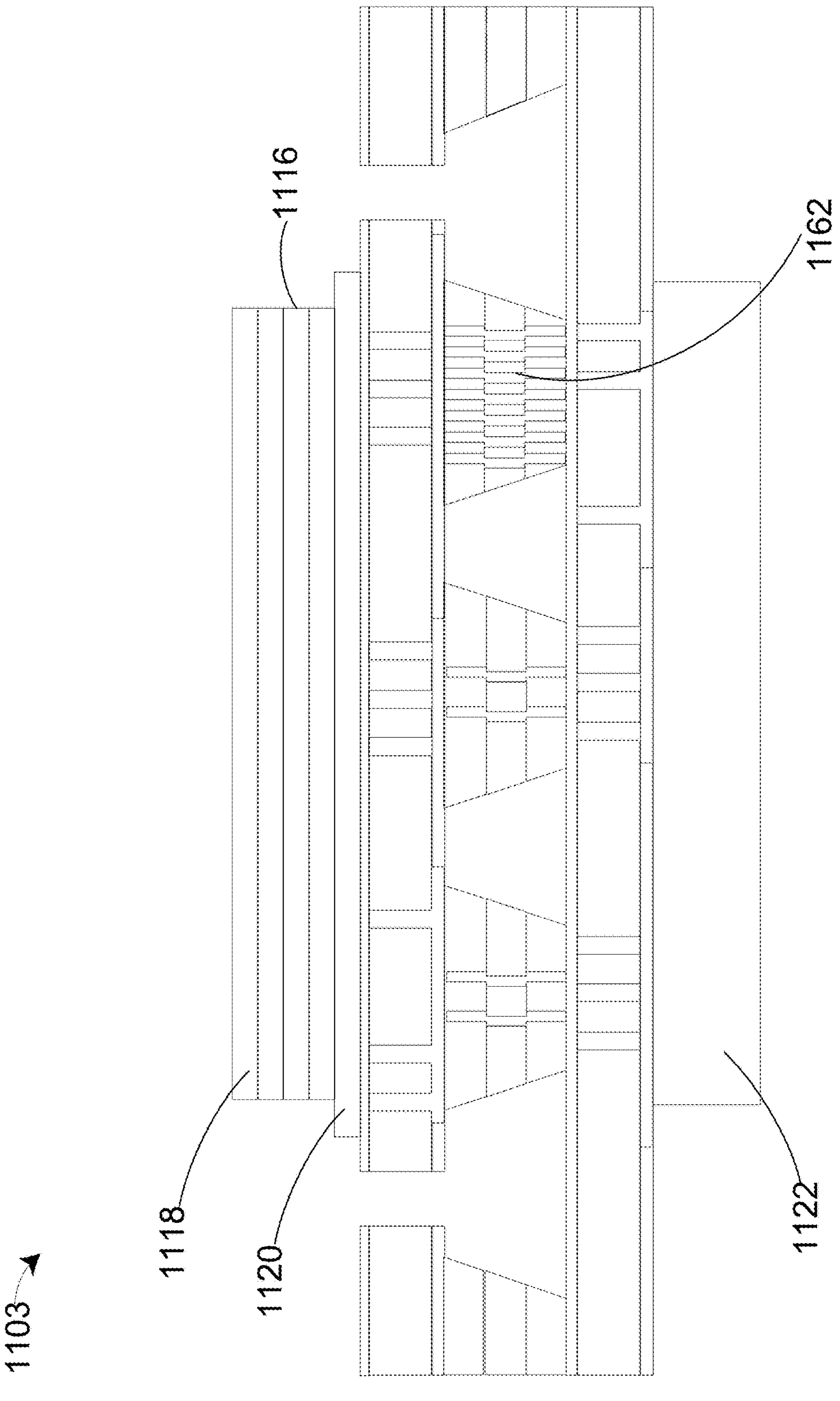
FIG. 11 is a schematic sectional view of an integrated cooling assembly comprising a signal redistribution network that couples a memory device and a logic device at opposing sides of a cold plate, in accordance with some embodiments of the present disclosure.

FIG. 11 shows a schematic sectional view of an integrated cooling assembly 1103 comprising a signal redistribution network that couples a plurality of first devices (e.g., a device stack) and a second device disposed on different sides of a cold plate interposer, in accordance with some embodiments of the present disclosure. For example, as shown the integrated cooling assembly 1103 includes a memory stack device 1116, and the second device is a logic device 1122. At the integrated cooling assembly 1103, the cold plate interposer is in a closed cavity configuration. The memory stack device 1116 comprises one or more memory layers 1118 and/or one or more logic layers 1120. The memory stack device 1116 is attached to a backside of the cold plate interposer. The logic device 1122 is attached to a frontside of the cold plate interposer. For example, the logic device 1122 may be a programmable logic chip, a complex programmable logic device, field-programmable gate array, an image sensor, a processing unit, etc.

In some embodiments, the devices 1116, 1122 are communicatively coupled through interconnects configured to provide high speed communication between the devices. At the integrated cooling assembly 1103, the cold plate interposer comprises thru interconnects 1162 that collectively define at least one high-speed data channel (e.g., based on bandwidth, number of signal paths, data rate, etc.). The thru interconnects 1162 may be referred to as high-speed interconnects. A high-speed data channel may also be referred to as a high-speed interconnect channel. In some embodiments, the thru interconnects 1162 are disposed through a peripheral support feature of the cold plate interposer (e.g., adjacent to an inlet/outlet opening). As an illustrative example, the peripheral support feature with the thru interconnects 1162 may have a higher density of interconnects that other support features. For example, the thru interconnects 1162 may include four or more interconnects in the same lateral area of the peripheral support feature as interconnects of another support feature. In this example, the high-speed interconnects may provide a higher number of parallel communication channels between the devices 1116 and 1122. In some embodiments, one or more of the devices 1116, 1122 prioritize passing selected signals using the thru interconnects 1162 (e.g., data packets having a high priority level). For example, the device 1122 may comprise a routing layer that redirects logic data through the thru interconnects 1162.

Figure 12:
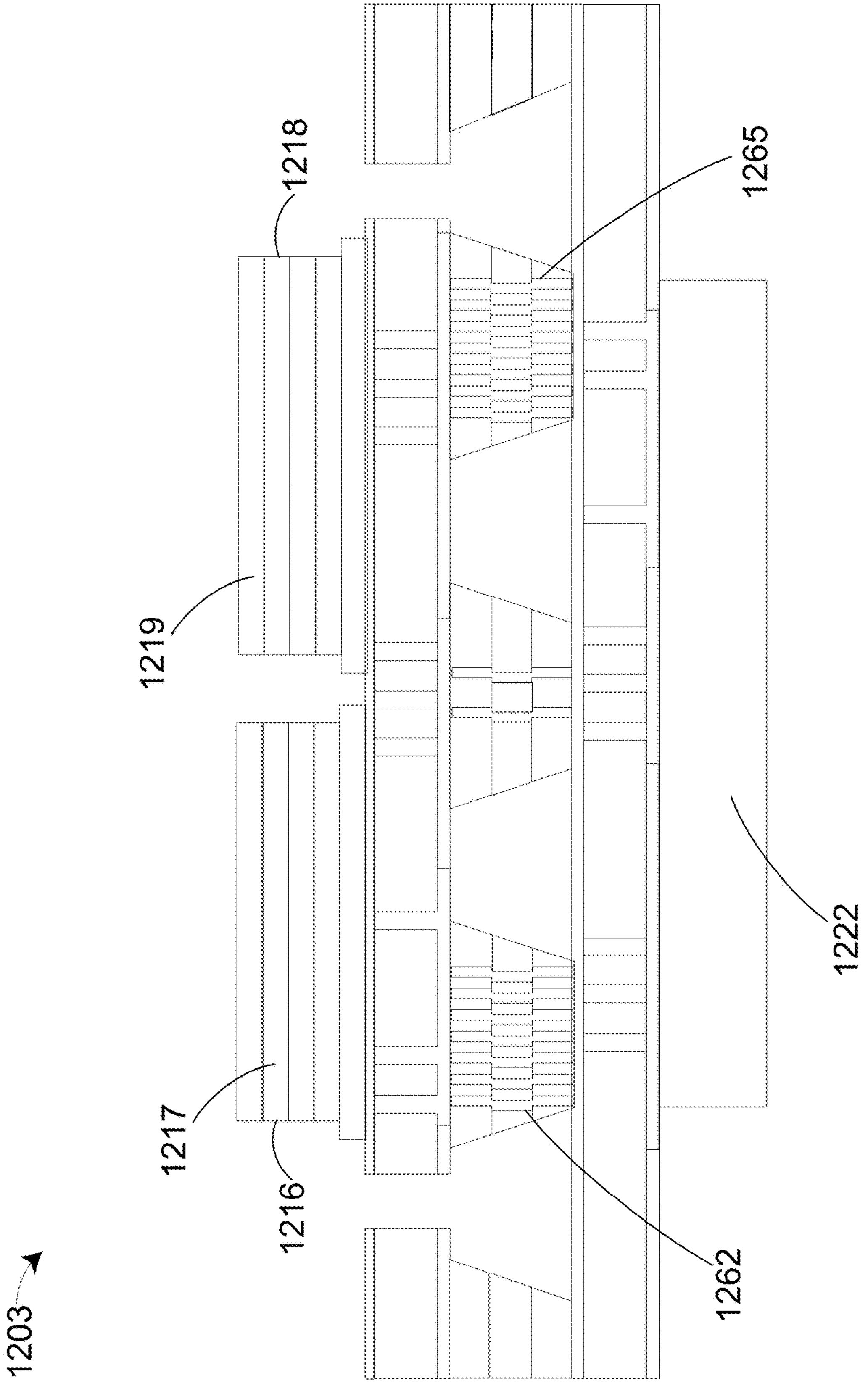
FIG. 12 is a schematic sectional view of an integrated cooling assembly comprising a signal redistribution network that couples a plurality of devices and a logic device, in accordance with some embodiments of the present disclosure.

FIG. 12 shows a schematic sectional view of an integrated cooling assembly 1203 comprising a signal redistribution network that couples a plurality of devices 1216, 1218 and a first device 1222, in accordance with some embodiments of the present disclosure. For illustrative purposes, the first device 1222 is a logic device, and the devices 1216, 1218 are memory stack devices. The logic device 1222 is attached to a first side of the cold plate interposer, and the devices 1216, 1218 are attached to a second side of the cold plate interposer. Each of the devices 1216, 1218 may be communicatively coupled to the logic device 1222 through respective parts of the signal redistribution network. The respective parts of the signal redistribution network may be electrically separate from each other such that the device 1216 is not coupled with the device 1218. Alternatively, the respective parts of the signal redistribution network may be coupled to each other such that signals may pass between the devices 1216 and 1218 (e.g., without passing through the logic device 1222). For example, the device 1218 may access data from a first memory layer 1217 through the signal redistribution network. Analogously, the device 1216 may access data from a second memory layer 1219 through the signal redistribution network.

The signal redistribution network comprises a first high-speed interconnect 1262 between the devices 1216 and 1222. The signal redistribution network comprises a second high-speed interconnect 1265 between the devices 1218 and 1222. In some embodiments, the device 1216 may pass signals to the device 1222 through the second high-speed interconnect 1265 and vice versa. For example, the signal redistribution network may have a shorter signal path between the device 1216 and a core of the logic device 1222 using the second high-speed interconnect 1265. Based on the shorter signal path, the device 1216 may pass signals from the first memory layer 1217 to the core of the logic device 1222 through the second high-speed interconnect 1265.

The embodiments discussed above are intended to be illustrative and not limiting. One skilled in the art would appreciate that individual aspects of the cooling assemblies, device packages, manufacturing processes, and/or methods discussed herein may be omitted, modified, combined, and/or rearranged without departing from the scope of the present disclosure. Only the claims that follow are meant to set bounds as to what the present disclosure includes.

What is claimed is:

1. A device package comprising:
 a semiconductor device having an active side and a backside opposite the active side; and
 a plurality of stacked and bonded layers, comprising:
  a first side and a second side opposite the first side, the first side having a base surface, a support feature that extends downwardly from the base surface, and sidewalls that extend downwardly from the base surface and surround the base surface and the support feature; and
  a first interconnect vertically disposed through the support feature, wherein:
   the first interconnect is electrically coupled to the semiconductor device through direct hybrid bonds formed between the first side of the plurality of stacked and bonded layers and the semiconductor device;
   the first side of the plurality of the stacked and bonded layers, and the backside of the semiconductor device define a coolant channel therebetween; and
   coolant flowing through the coolant channel directly contacts the backside of the semiconductor device.

2. The device package of claim 1, wherein the plurality of stacked and bonded layers collectively forms a cold plate.

3. The device package of claim 2, wherein the first side of the cold plate, the support feature, and the backside of the semiconductor device define the coolant channel.

4. The device package of claim 1, wherein the semiconductor device and the plurality of stacked and bonded layers are part of an integrated cooling assembly.

5. The device package of claim 1, wherein:
 one or more first layers of the plurality of stacked and bonded layers comprises the sidewalls and the support feature;
 a second layer of the plurality of stacked and bonded layers is disposed between the base surface and the second side;
 the second layer comprises a second interconnect vertically disposed therethrough; and the first and second interconnects are electrically coupled through direct hybrid bonds formed between the one or more first layers and the second layer.

6. The device package of claim 1, wherein the plurality of stacked and bonded layers comprises a power plane and/or a ground plane.

7. The device package of claim 6, wherein the first interconnect connects the semiconductor device to at least one of the power plane or the ground plane.

8. The device package of claim 1, wherein the support feature decreases in width from the base surface to a bonding interface of the first side of the plurality of stacked and bonded layers and the semiconductor device.

9. The device package of claim 1, wherein the sidewalls of plurality of stacked and bonded layers are sloped.

10. The device package of claim 1, wherein:

the plurality of stacked and bonded layers comprises a stack of first layers;

each of the first layers comprises a segment of the first interconnect; and each segment of the first interconnect is connected to another vertically adjacent segment of the first interconnect through direct hybrid bonds formed between the first layers.

11. A microelectronic package comprising:

a semiconductor device;

a cold plate coupled to the semiconductor device, wherein:

the cold plate comprises a plurality of stacked and bonded layers, a base surface, a plurality of sidewalls, and a support feature;

the plurality of sidewalls extend downwardly from the base surface to define a cavity;

the support feature extends downwardly from the base surface and is disposed in the cavity; and the cold plate is coupled to the semiconductor device through direct hybrid bonds formed between the support feature and the semiconductor device; and a first interconnect vertically disposed through the support feature, wherein:

the first interconnect is electrically coupled to the semiconductor device through the direct hybrid bonds formed between the cold plate and the semiconductor device;

the cold plate and the semiconductor device define a coolant channel therebetween; and coolant flowing through the coolant channel directly contacts the semiconductor device.

12. The microelectronic package of claim 11, wherein the semiconductor device and the plurality of stacked and bonded layers are part of an integrated cooling assembly.

13. The microelectronic package of claim 11, wherein:

one or more first layers of the plurality of stacked and bonded layers comprises the plurality of sidewalls and the support feature;

a second layer of the plurality of stacked and bonded layers is disposed between the base surface and a first side of the cold plate;

the second layer comprises a second interconnect vertically disposed therethrough; and the first and second interconnects are electrically coupled through direct hybrid bonds formed between the one or more first layers and the second layer.

14. The microelectronic package of claim 11, wherein the semiconductor device is a first device and the first interconnect communicatively couples the first device and one or more second devices through the direct hybrid bonds.

15. The microelectronic package of claim 14, wherein the one or more second devices comprise a memory stack, and wherein the first device is a logic device.

16. The microelectronic package of claim 15, wherein the cold plate further comprises a peripheral support feature disposed at a periphery of the cold plate, wherein the peripheral support feature comprises a plurality of interconnects vertically disposed therethrough, and wherein the plurality of interconnects communicatively couples the memory stack and the logic device.

17. The microelectronic package of claim 11, wherein the support feature decreases in width from the base surface to a bonding interface of the first side of the plurality of stacked and bonded layers and the semiconductor device.

18. The microelectronic package of claim 11, wherein:

the plurality of stacked and bonded layers comprises a stack of first layers;

each of the first layers comprises a segment of the first interconnect; and each segment of the first interconnect is connected to another vertically adjacent segment of the first interconnect through direct hybrid bonds formed between the first layers.

* * * * *